(12) United States Patent
Chen et al.

(10) Patent No.: US 6,423,949 B1
(45) Date of Patent: Jul. 23, 2002

(54) MULTI-ZONE RESISTIVE HEATER

(75) Inventors: Steven Aihua Chen, Fremont; Henry Ho, San Jose; Michael X. Yang, Fremont; Bruce W. Peuse, San Carlos; Karl Littau, Palo Alto; Yu Chang, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/314,845

(22) Filed: May 19, 1999

(51) Int. Cl.[7] .............................. H05B 3/68; C23C 16/00
(52) U.S. Cl. ..................................... 219/444.1; 118/725
(58) Field of Search .................... 219/444.1, 446.1, 219/448.11, 448.12, 465.1, 466.1, 467.1, 544; 118/726, 727, 728, 729, 730

(56) References Cited

U.S. PATENT DOCUMENTS

| | | | | |
|---|---|---|---|---|
| 2,387,460 A | * | 10/1945 | Myers .................... | 219/448.16 |
| 2,640,906 A | * | 6/1953 | Haynes .................. | 219/466.1 |
| 4,357,526 A | * | 11/1982 | Yamamoto et al. ....... | 219/544 |
| 5,225,663 A | * | 7/1993 | Matsumura et al. ..... | 219/444.1 |
| 5,476,548 A | * | 12/1995 | Lei et al. ................ | 118/728 |
| 5,904,872 A | * | 5/1999 | Arami et al. ............ | 219/444.1 |
| 6,080,970 A | * | 6/2000 | Yoshida et al. .......... | 219/444.1 |

* cited by examiner

Primary Examiner—Sang Paik
(74) Attorney, Agent, or Firm—Blakely, Sokoloff, Taylor & Zafman

(57) ABSTRACT

A heating apparatus including a stage comprising a surface having an area to support a wafer and a body, a shaft coupled to the stage, and a first and a second heating element. The first heating element is disposed within a first plane of the body of the stage. The second heating element is disposed within a second plane of the body of the stage at a greater distance from the surface of the stage than the first heating element. A reactor comprising a chamber, a resistive heater, a first temperature sensor, and a second temperature sensor. A resistive heating system for a chemical vapor deposition apparatus comprising a resistive heater. A method of controlling the temperature in a reactor comprising providing a resistive heater in a chamber of a reactor, measuring the temperature with at least two temperature sensors, and controlling the temperature in the reactor by regulating a power supply to the first heating element and the second heating element according to the temperature measured by the first temperature sensor and the second temperature sensor.

62 Claims, 12 Drawing Sheets

MULTI-ZONE RESISTIVE HEATER

BACKGROUND OF THE INVENTION

1. Field of the Invention

The invention relates to heating mechanisms for process chambers, particularly, heating mechanisms for chemical vapor deposition chambers.

2. Description of Related Art

Chemical vapor deposition (CVD) is a popular process for depositing various types of films on substrates and is used extensively in the manufacture of semiconductor-based integrated circuits such as, for example, the processing of semiconductor wafers to form individual integrated circuit device. In typical CVD processing, a wafer or wafers are placed in a deposition or reaction chamber and reactant gases are introduced into the chamber and are decomposed and reacted at a heated surface to form a thin film on the wafer or wafers.

In general, there are single-wafer and multi-wafer CVD reaction chambers in use today. Multi-wafer reaction chambers typically resemble vertical furnaces capable of holding, for example, 25 wafers or more. For low pressure CVD (LPCVD), for example, 0.25–2.0 torr, for the deposition of $Si_3N_4$ or polysilicon, a typical deposition time for a multi-wafer chamber might be several hours. $Si_3N_4$, for example, is formed at a temperature between 700–800° C. and a deposition time of 4–5 hours depending upon layer thickness in a multi-wafer chamber.

A second type of CVD reaction chamber is a single-wafer chamber in which a wafer is supported in the chamber by a stage or susceptor. The susceptor may rotate during the reaction process. For an LPCVD $Si_3N_4$ deposition, for example, a suitable layer thickness may be produced at 700–800° C. in about two minutes.

In general, there are two types of heating schemes used in CVD systems: resistive heating schemes that utilize a resistive heating element localized at the wafer, and radiant heating schemes that use a radiant heating element such as a lamp or lamps usually placed outside the reaction chamber. Resistive heating schemes in a single-wafer chamber generally incorporate the resistive heating element directly in the stage or susceptor that supports the wafer in the chamber. In this manner, the reaction produced during the deposition may be generally more localized at the wafer.

In single-wafer resistive heating schemes that utilize a heating element within a stage or susceptor that supports a wafer, the heating element is typically a thin layer of conductive material, such as a thin coiled layer (about 2 mils) of a molybdenum (Mo) material formed in a single plane of the body of the susceptor. This design may be described as a "single-zone resistive heater," the "zone" description referring to the location of the heating element in a single plane in the body of the stage or susceptor. The CVD reaction in which the resistive heaters are used typically has a temperature compatibility to approximately 550° C. At higher temperatures, temperature uniformity becomes problematic. One reason is that heat loss in a resistive heater increases with higher temperatures, particularly at the edges of the stage or susceptor. Single-zone resistive heaters typically do not have the ability to compensate for differences in heat loss across the stage or susceptor. The pressure in a chamber will also modify the temperature stability of single-zone resistive heaters.

In addition to providing the requisite temperature, the resistive heating element must also be amenable to the chemical environment in the reaction chamber including high temperature and chemical species. One solution to the compatibility consideration in prior art single-zone resistive heaters is to form the susceptor of aluminum nitride (AlN) with the heating element formed inside the susceptor.

Radiant heating schemes generally position lamps behind heat-resistant protective glass or quartz in the reaction chamber. Since the entire chamber is heated by the lamps, the CVD reaction occurs throughout the chamber.

Radiant or lamp heating schemes offer the benefit of generating a high chamber temperature and controlling that temperature better than resistive heating schemes. However, since radiant heating schemes utilize heating elements, e.g., lamps, placed outside of the reaction chamber, the ability to control the temperature in the chamber becomes more difficult as the chamber walls become coated with chemicals or other materials or reaction products used in the reaction chamber. Thus, as the materials used in the chamber deposit on the chamber glass or quartz, for example, the effectiveness of the heating is reduced and the process performance is effected.

In this regard, a reaction chamber used in a radiant heating scheme must be cleaned often. A typical cleaning agent is nitrogen trifluoride ($NF_3$). In $Si_3N_4$ CVD processes, for example, $Si_3N_4$ reaction products form on the chamber walls and other components inside the chamber, such as a quartz window(s). $Si_3N_4$ is difficult to clean from a reaction chamber with a cleaning agent like $NF_3$. The cleaning temperature generally must be high in order to dissociate the $NF_3$ and provide enough thermal energy to clean $Si_3N_4$. If the cleaning temperature is high, the $NF_3$ will also attack components in the chamber, such as the susceptor. A remote plasma source used to energize the $NF_3$ can reduce the cleaning temperature but activated $NF_3$ species (particularly radicals) tend to attack quartz components. Therefore, currently there is no effective cleaning solution for radiant-based chambers. Since the walls of the reaction chamber are not easily cleaned with $NF_3$, $Si_3N_4$ material accumulates and shortens the lifetime of the chamber.

In LPCVD reactions, temperature uniformity is generally important. The surface reaction associated with a CVD process can generally be modeled by a thermally activated phenomenon that proceeds at a rate, R, given by the equation:

$$R=R_o e^{[-E^a/kT]}$$

where $R_o$ is the frequency factor, $E_a$ is the activation energy in electron volts (eV), and T is the temperature in degrees Kelvin. According to this equation, the surface reaction rate increases with increasing temperature. In a LPCVD process such as a $Si_3N_4$ deposition, the activation energy ($E_a$) is generally very high, on the order of 0.9–1.3 eV. Accordingly, to obtain a uniform thickness across the wafer, the temperature uniformity across the wafer should be tightly controlled, preferably on the order of ±2.5° C. or less for temperatures around 750° C.

Prior art single-wafer radiant heating schemes offer acceptable temperature uniformity even at higher temperatures (e.g., 750° C.) when the chamber is clean. However, as materials accumulate on the walls of the chamber, temperature uniformity becomes difficult.

It is also difficult to obtain a uniform high temperature (e.g., 700–750° C.) across a wafer with a single-zone resistive heater. As noted, in general, heat loss is not uniform across the surface of a susceptor at higher temperatures. A single-zone heater cannot compensate, for example, for a greater heat loss toward the edges of the susceptor than at its center. Thus, temperature uniformity is a problem.

A second problem with single-zone resistive heaters such as described above and temperatures of 750° C. is problems associated with localized heating. At high temperatures, single-zone heaters exhibit concentrated localized heating associated with high density power applied to the heating element at a localized area. Consequently, temperature uniformity is affected. A third problem with single-zone resistive heaters is that variations in manufacturing of the heating element can cause fluctuations in performance of a heating element which can lead to non-uniformity. The single-zone heater cannot be adjusted to compensate for the manufacturing variation. Further, at high temperature operation, single-zone heaters have shorter lifetimes due to the high power density applied at the power terminals and to the heating elements.

Still further, prior art resistive heaters and chambers that provide such heaters offer limited dynamic temperature measurement. In general, the only dynamic temperature measurement (i.e., real-time temperature measurement) is provided by a thermocouple placed generally at the center of the susceptor at a point below the surface of the susceptor. The temperature measurement (such as by a thermocouple) may provide an accurate temperature measurement of the temperature at the center of the susceptor, but cannot provide any information about the temperature at the edges of the susceptor. Thermal cameras that view the temperature within the chamber from a vantage point outside the chamber have been employed but generally only offer static information about the temperature in the chamber. Any changes to the chamber pressure associated with adjusting the CVD process recipe also tend to play a role in the ability to control the reaction temperature in the chamber. Thus, single-zone resistive heating schemes are generally limited to operating at one particular temperature and pressure. Changes to either the chamber temperature or the chamber pressure negatively effect the temperature uniformity. Thus, such single-zone-heating schemes are inadequate for high temperature CVD processes.

What is needed is a reaction chamber and a heating scheme for a reaction chamber compatible with high temperature operation, e.g., on the order of 700° C. or greater, that is chemically resistant to the elements and achieves high temperature uniformity localized at a reaction site.

SUMMARY OF THE INVENTION

A heating apparatus is disclosed. In one embodiment, the heating apparatus includes a stage or susceptor comprising a surface having an area to support a wafer and a body, a shaft coupled to the stage, and a first and a second heating element. The first heating element is disposed within a first plane of the body of the stage. The second heating element is disposed within a second plane of the body of the stage at a greater distance from the surface of the stage than the first heating elements. According to this embodiment, a multi-zone heating apparatus is disclosed defined by the first and second heating element. In this manner, the invention allows individual control of at least two distinct heating zones of a stage thus increasing the temperature control and temperature uniformity of the stage as compared to prior art single-zone heating apparatuses.

In one aspect, the heating apparatus is a resistive heater capable of operating at high temperatures and providing enhanced temperature uniformity over single-zone resistive heaters. Each heating element may be separately controlled to maintain a collectively uniform temperature across the surface of the stage. For example, in the situation where heat loss is greater at certain areas of the stage, heating zones associated with those areas may be supplied with more resistive heat to maintain a chosen operating temperature despite the heat loss. One way this is accomplished is by varying the resistance of a multiple heating elements across an area of the stage. Where, for example, heat loss through the shaft is determined to be greater than the heat loss at other areas of the stage, the resistance of one heating element in area of the stage corresponding with (e.g., over) the shaft is increased. Similarly, where heat loss at the edge at other area of the stage is determined to be greater than the heat loss at other areas, the resistance of one heating element in an area corresponding with the edge area of the stage is increased.

Also disclosed is a reactor comprising, in one embodiment a chamber and a resistive heater. The resistive heater includes a stage disposed within the chamber including a surface having an area to support a wafer and a body, a shaft coupled to a stage, a first heating element disposed within a first plane of the body of the stage, and a second heating element disposed within a second plane of the body of the stage. In one aspect, the power density of the first heating element is greater than the power density of the second heating element in an area corresponding with a first portion of the stage area. At the same time, the power density of the first heating element is less than the power density of the second heating element in an area corresponding with a second portion of the stage area.

As described, the reactor of the invention provides a multi-zone resistive heater, such as a single-wafer heater, including at least two resistive heating elements disposed within separate planes of a stage or susceptor. The distinct heating elements allow, in one instance, separate areas of the stage to be individually regulated by varying the power density of the individual heating elements in different areas of the stage. In one embodiment, by placing the first heating element at a position closer to the surface of the stage than the second heating element, a greater power density can be supplied to the second heating element to account for greater heat losses at areas associated with the edge of the stage while minimizing potential localized "hot spots" associated with the greater power density. Multiple temperature sensors associated with one embodiment of the reactor offer the opportunity to more uniformly control the temperature of the resistive heater than prior art reactors having only a single thermocouple in the center of the susceptor.

A resistive heating system for a chemical vapor deposition apparatus is further disclosed. The heating system includes, in one embodiment, a resistive heater comprising a stage including a surface having an area to support a wafer and a body, a shaft coupled to the stage, a first heating element, and a second heating element disposed within distinct planes of the body of the stage. The heating system of the invention provides a multi-zone resistive heater with at least two distinct heating elements to control the temperature of the heater which improves the temperature uniformity in, for example, a high-temperature CVD process, including process conditions operated at temperature in excess of 700° C. (e.g., LPCVD)

A method of controlling the temperature in the reactor is still further disclosed. In one embodiment, the method comprises supplying a power to a first resistive heating element disposed within a first plane of the body of a stage of a resistive heater and a second resistive heating element disposed within a second plane of the body of the stage. The method also comprises varying a resistance of at least one of the first resistive heating element and the second resistive heating elements in at least two areas of the stage.

Additional embodiments of the apparatus, the reactor, the heating system, and the method of the invention, along with other features and benefits of the invention are described in the figures, detailed description, and claims set forth below.

DETAILED DESCRIPTION OF THE INVENTION

The invention generally relates to embodiments of a heating apparatus, a reactor, a heating system for a chemical vapor deposition apparatus, and a method of controlling the temperature in the reactor. In one aspect, the invention utilizes a heating apparatus suitable for supporting a single-wafer (e.g., a semiconductor wafer) on a stage or susceptor in a reaction chamber. The heating apparatus includes at least two heating elements to maintain a uniform reaction temperature of the surface of the susceptor (and of a wafer on a susceptor). In one embodiment, each heating element lies in a distinct plane in the susceptor of the heater. Each heating element is coupled, in one embodiment, to a power source and the resistance of each heating element is varied across an area of the stage. The temperature associated with different areas of the surface of the susceptor or at the wafer may be measured and the heating elements controlled. By controlling the individual heating elements of the heating apparatus, factors such as heat loss and pressure changes in the reactor are accommodated and improved temperature uniformity is achieved even at temperatures greater than 700° C. Thus, a heating apparatus having multiple heating elements (e.g., a multi-zone heater) provides a useful heating element for a CVD reactor or system and high temperature LPCVD processes that are preferred in the deposition of $Si_3N_4$ and polysilicon deposition.

Figure 1:
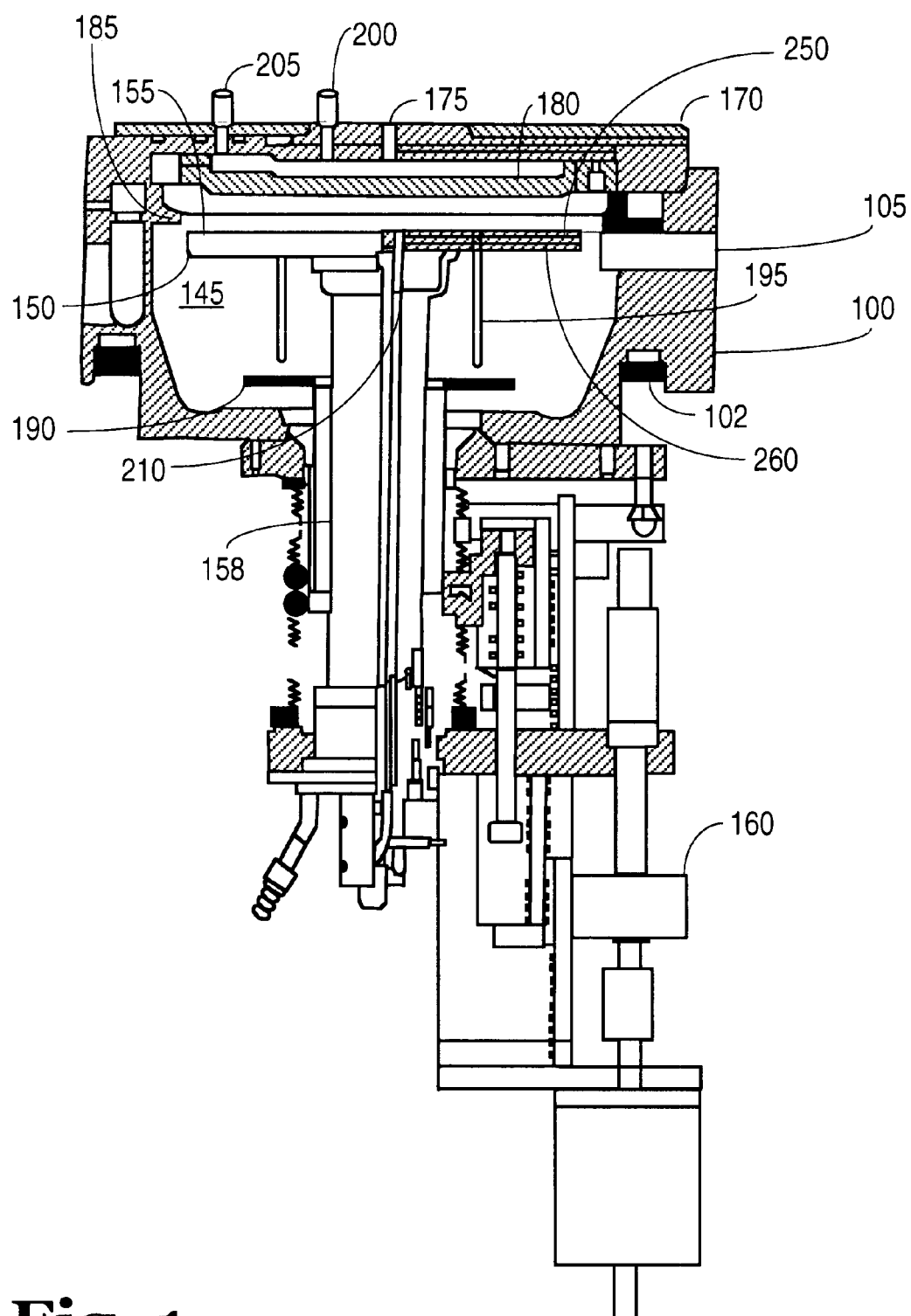
FIG. 1 is a cross-sectional side view of the CVD system showing the heater inside a reaction chamber in a "wafer-process" configuration in accordance with an embodiment of the invention.
Figure 2:
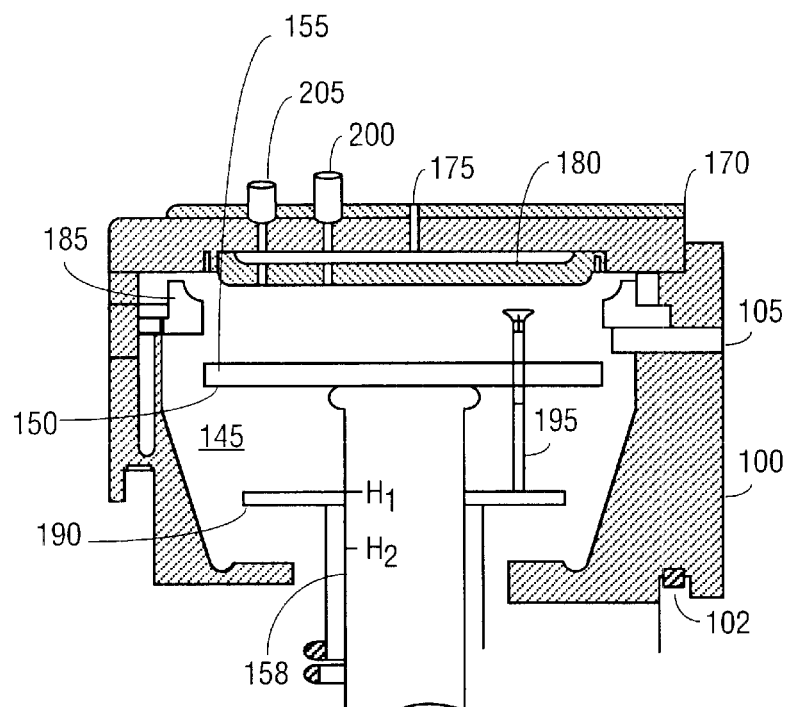
FIG. 2 is a cross-sectional side view of the CVD system of FIG. 1 showing a heater inside a reactor chamber in a "wafer-separate" configuration in accordance with an embodiment of the invention.
Figure 3:
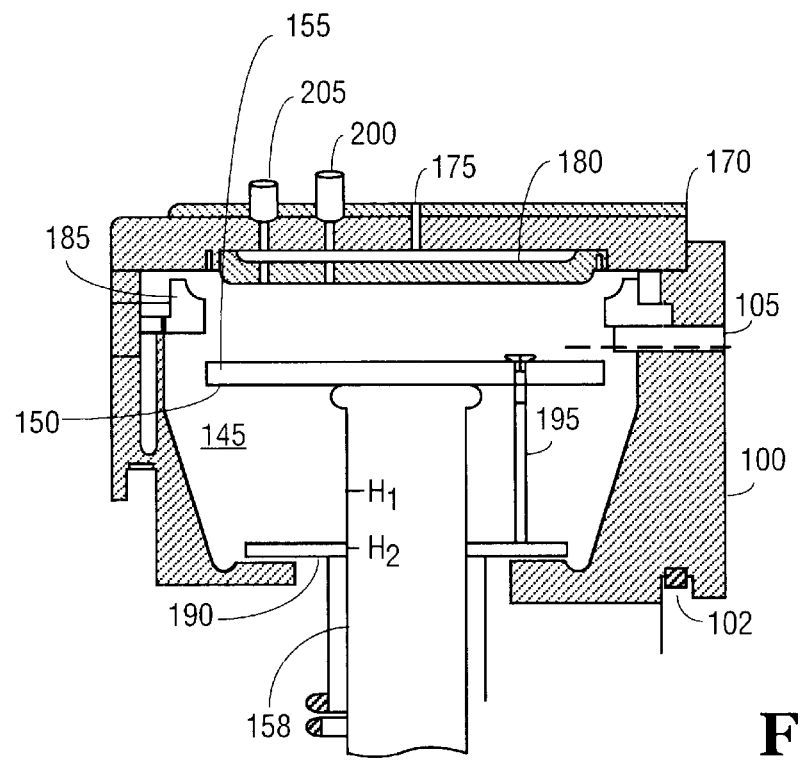
FIG. 3 is a cross-sectional side view of the CVD system of FIG. 1 showing a heater inside a reactor chamber in a "wafer-load" configuration in accordance with an embodiment of the invention.

FIG. 1, FIG. 2 and FIG. 3 show cross-sectional views of a portion of a system incorporating a reactor according to an embodiment of the invention. Such a system is used, for example, in a CVD process, including an LPCVD process for the deposition of $Si_3N_4$ or polysilicon films on a wafer or substrate.

FIG. 1 illustrates the inside of process chamber body 100 in a "wafer-process" position. FIG. 2 shows the same view of the chamber in a "wafer-separate" position. Finally, FIG. 3 shows the same cross-sectional side view of the chamber in a "wafer-load" position.

FIG. 1, FIG. 2 and FIG. 3 show chamber body 100 that defines reaction chamber 145 where the reaction between a process gas or gases and the wafer takes place, e.g., a CVD reaction. Chamber body 100 is constructed, in one embodiment, of aluminum and has passages 102 for water to be pumped therethrough to cool chamber body 100 (e.g., a "cold-wall" reaction chamber). Resident in chamber 145 is resistive heater 150 including, in this view, susceptor 155 supported by shaft 158. In one embodiment, susceptor 155 has a surface area sufficient to support a semiconductor wafer. A cynlindrical susceptor having a diameter of approximately 9.33 inches supported by a shaft having a length of approximately 10 inches is suitable to support an eight inch diameter wafer.

Process gas enters otherwise sealed chamber 145 through opening 175 in a top surface of chamber lid 170 of chamber body 100. The process gas is distributed throughout chamber 145 by perforated face plate 180 located in this view above resistive heater 150 and coupled to chamber lid 170 inside chamber 145.

A wafer is placed in chamber 145 on susceptor 155 through entry port 105 in a side portion of chamber body 100. To accommodate a wafer for processing, heater 150 is lowered so that the surface of susceptor 155 is below entry port 105 as shown in FIG. 3. Typically by a robotic transfer mechanism, a wafer is loaded by way of, for example, a transfer blade into chamber 145 onto the superior surface of susceptor 155. Once loaded, entry port 105 is sealed and heater 150 is advanced in a superior (e.g., upward) direction toward face plate 180 by lifter assembly 160 that is, for example, a step motor. The advancement stops when the wafer is a short distance (e.g., 400–700 mils) from face plate 180. At this point, process gases controlled by a gas panel flow into the chamber 145 through gas distribution port 175, through perforated face plate 180, and typically react or are deposited on a wafer to form a film. In a pressure controlled system, the pressure in chamber 145 is established and maintained by a pressure regulator or regulators coupled to chamber 145. In one embodiment, for example, the pressure is established and maintained by baratome pressure regulator(s) coupled to chamber body 100 as known in the art.

After processing, residual process gas or gases are pumped from chamber 145 through pumping plate 185 to a collection vessel. Chamber 145 may then be purged, for example, with an inert gas, such as nitrogen. After processing and purging, heater 150 is advanced in an inferior direction (e.g., lowered) by lifter assembly 160 to the position shown in FIG. 2. As heater 150 is moved, lift pins 195, having an end extending through openings or through-bores in a surface of susceptor 155 and a second end extending in a cantilevered fashion from an inferior (e.g., lower) surface of susceptor 155, contact lift plate 190 positioned at the base of chamber 145. As is illustrated in FIG. 2, in one embodiment, at this point, lift plate 190 does not advance from a wafer-load position to a wafer-separate position as does heater 150. Instead, lift plate 190 remains at a reference level, $H_1$, indicated in FIG. 2 on shaft 158. As heater 150 continues to move in an inferior direction through the action of lifter assembly 160, lift pins 195 remain stationary and ultimately extend above the superior or top surface of susceptor 155 to separate a processed wafer from the surface of susceptor 155.

Once a processed wafer is separated from the surface of susceptor 155, a transfer blade of a robotic mechanism is inserted through opening 105 to a "pick out" position inside chamber 145. The "pick out" position is below the processed wafer. Next, lifter assembly 160 inferiorly moves (e.g., lowers) lift plate 190 to, for example, a second reference level, $H_2$, indicated in FIG. 3 on shaft 158. By moving lift plate 190 in an inferior direction, lift pins 195 are also moved in an inferior direction, until the underside of the processed wafer the surface of lift pin 195 contacts the transfer blade. The processed wafer is then removed through entry port 105 by, for example, a robotic transfer mechanism that removes the wafer and transfers the wafer to the next processing step. A second wafer may then be loaded into chamber 145. The steps described above are reversed to bring the wafer into a process position. A detailed description of one suitable lifter assembly 160 is described in U.S. Pat. No. 5,772,773, assigned to Applied Materials, Inc., of Santa Clara, Calif.

In high temperature operation, such as LPCVD processing of $Si_3N_4$ or polysilicon, the reaction temperature inside chamber 145 can be as high as 750° C. or more. Accordingly, the exposed components in chamber 145 must be compatible with such high temperature processing. Such materials should also be compatible with the process gases and other chemicals, such as cleaning chemicals, that may be introduced into chamber 145. In one embodiment, exposed surfaces of heater 150 are comprised of aluminum nitride (AlN). For example, susceptor 155 and shaft 158 may be comprised of similar aluminum nitride material. Alternatively, in a preferred construction, the surface of susceptor 155 is comprised of high thermally conductive aluminum nitride material (on the order of 95% purity with a thermal conductivity from 140 W/mK to 200 W/mK) while shaft 158 is comprised of a lower thermally conductive aluminum nitride (on the order of 60 W/mK to 100 W/mK). Susceptor 155 of heater 150 is typically bonded to shaft 158 through diffusion bonding or brazing as such coupling will similarly withstand the environment of chamber 145.

Lift pins 195 are also present in chamber 145 during processing. Accordingly, lift pins 195 must be compatible with the operating conditions within chamber 145. A suitable material for lift pins 195 includes, but is not limited to, sapphire or aluminum nitride. A further component that is exposed to the environment of chamber 145 is lift plate 190. Accordingly, in one embodiment, lift plate 190, including a portion of the shaft of lift plate 190, is comprised of an aluminum nitride (e.g., thermally conductive aluminum nitride on the order of 140 W/mK to 200 W/mK) composition.

FIG. 1 also shows a cross-section of a portion of heater 150, including a cross-section of the body of susceptor 155 and a cross-section of shaft 158. In this illustration, FIG. 1 shows the body of susceptor 155 having two heating elements, first heating element 250 and second heating element 260. First heating element 250 and second heating element 260 are formed in distinct planes in the body of susceptor 155. For a susceptor having a thickness of approximately 0.68 inches (or 1.728 cm), first heating element 250 is located approximately 5–8 mm from the surface of the susceptor. The significance of the location of first heating element 250 relative to the surface of susceptor 155 will be discussed below.

Each heating element (e.g., heating element 250 and heating element 260) is made of a material with thermal expansion properties similar to the material of the susceptor. One such material includes molybdenum (Mo), which has a thermal expansion coefficient similar to aluminum nitride. In one embodiment, each heating element includes a thin layer (e.g., 2 mils) of molybdenum material in a coiled configuration.

In FIG. 1, second heating element 260 is formed in an inferiorly located plane of the body of susceptor 155 that is located inferiorly (relative to the surface of susceptor 155) to first heating element 250. In one embodiment, for a susceptor having a thickness of approximately 1.728 cm, second heating element 260 is located in a plane approximately 5 mm from the plane of first heating element 250.

In this embodiment, first heating element 250 and second heating element 260 are separately coupled to power terminals. The power terminals extend in an inferior direction as conductive leads through a longitudinally extending opening through shaft 158 to a power source that supplies the requisite energy to heat the surface of susceptor 155.

Also of note in the cross-section of heater 150 as shown in FIG. 1 is the presence of thermocouple 210. Thermocouple 210 extends through the longitudinally extending opening through shaft 158 to a point just below the superior or top surface of susceptor 155. In an embodiment where susceptor 155 is cylindrical, thermocouple 210 extends at a point corresponding approximately with the midpoint of the cylindrical body.

As noted above, the environment inside reactor 145 may be extreme for many materials. By locating thermocouple 210 as well as the conductive leads to a power source, inside an opening in a reactor-compatible shaft and susceptor, concerns of degradation or decomposition of these components are alleviated as the components are not exposed to the environment of chamber 145.

Figure 4:
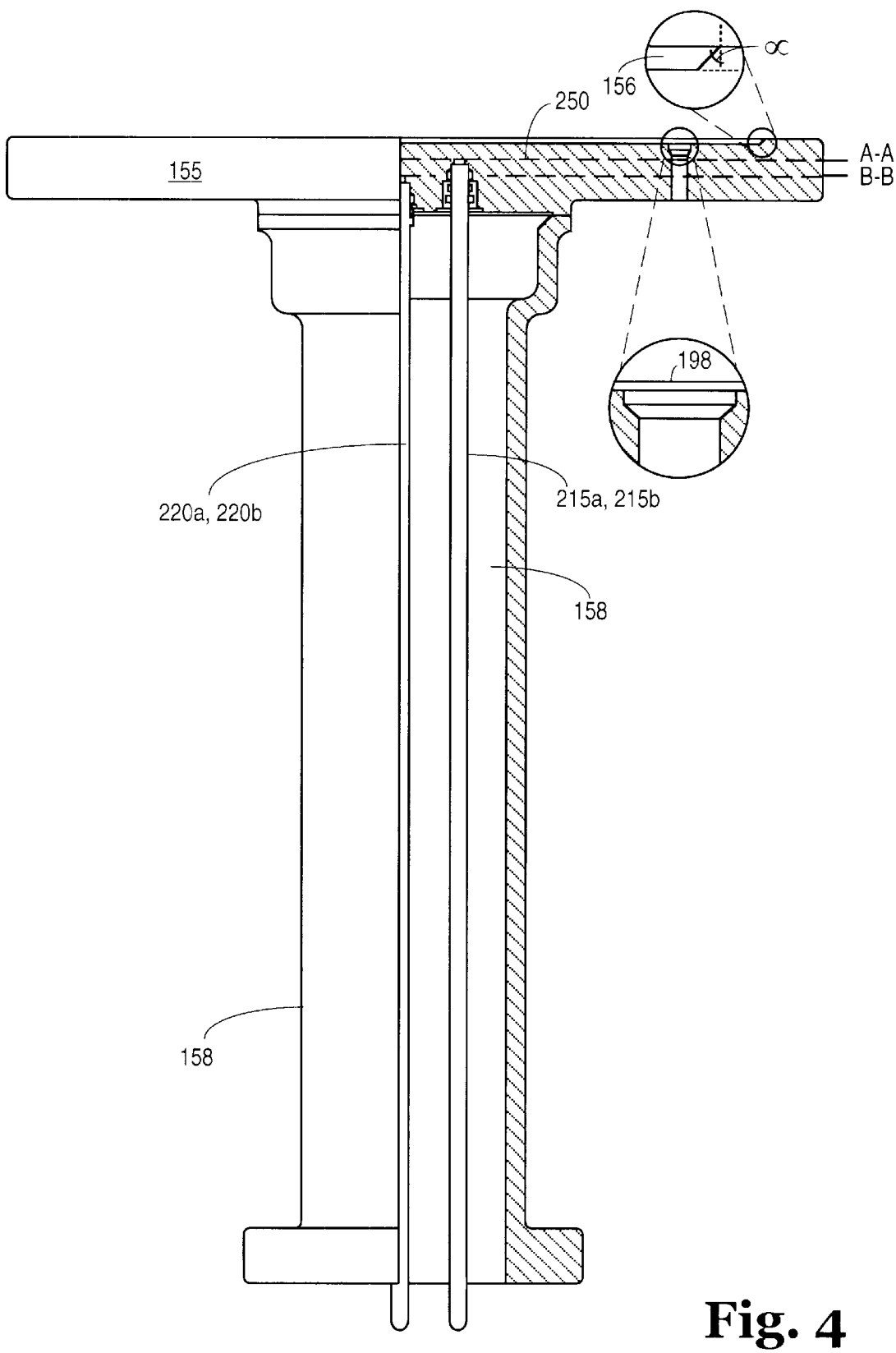
FIG. 4 is an expanded one-half cross-sectional view of a portion of the heater portion of the CVD system in accordance with an embodiment of the invention.

FIG. 4 illustrates a one-half cross-sectional side view of heater 150 including susceptor 155 and shaft 158. FIG. 4 shows shaft 158 having a longitudinally extending opening about its length to accommodate various components of heater 150. Those components include conductive leads 215a and 215b to first heating element 250 and conductive leads 220a and 220b to second heating element 260. Conductive leads 215a, 215b, 220a and 220b are coupled at one end to one or more power supplies that provide the necessary energy to each heating element to supply the requisite temperature for the particular process.

As can be seen in FIG. 4, the conductive leads extend into the body of susceptor 155 of heater 150. Conductive leads 215a and 215b extend superiorly from shaft 158 into the body of susceptor 155 to a point defined approximately by a plane denoted by line A—A corresponding to the location of first heating element 250 formed in the body of susceptor 155. Conductive leads 220a and 220b extend superiorly from shaft 158 into the body of susceptor 155 to a point further from the surface of susceptor 155 than conductive leads 215a and 215b. Conductive leads 220a and 220b extend to a point defined approximately by a plane denoted by line B—B corresponding to the location of second heating element 260 formed in the body of susceptor 155.

FIG. 4 also shows a magnified view of the surface of susceptor 155. In this view, the surface of susceptor 155 is shown to have wafer packet 156 that is an approximately 0.03 inch deep valley. A wafer loaded on the surface of susceptor 155 sits within wafer pocket 156. Wafer packet 156 serves, in one manner, to trap a wafer on the surface of susceptor 155 or discourage a wafer from sliding off the surface of susceptor 155 particularly during the wafer-load process. In one embodiment, wafer packet has an angled edge, for example, an edge having an angle, α of 60° to 80°.

FIG. 4 also shows a magnified view of opening 198 to support lift pin 195. In one embodiment, lift pin 195 has a head having a greater diameter than its body. Lift pin 195 rests flush with the surface of susceptor 155 (flush with the surface of wafer packet 156) when heater 150 is in a "wafer-process" state. Accordingly, opening 198 has a wide enough diameter at its superior end to accommodate the head of lift pin 195. Thus, for a lift pin having a head portion of a thickness of approximately 0.11 inches, the superior end of opening 198 will have a depth of 0.11 inches to accommodate the head of lift pin 195. The diameter of opening 198 is narrowed below its superior end to prevent lift pin 195 from escaping through the opening. It is to be appreciated that heat loss may be experienced through opening 198. Accordingly, in one embodiment, the diameter of opening 198 is minimized to reduce heat loss. For example, a diameter of the superior portion of opening 198 is 0.180 inches to accommodate the head of a lift pin having a similar of slightly smaller diameter. The remaining portion of opening 198 is 0.13 inches to accommodate the body of a lift pin having a similar or slightly smaller diameter.

It is to be appreciated that, in certain instances, a CVD reaction process will be operated at other than atmospheric pressure. In the case of LPCVD reaction conditions, for example, the pressure inside chamber 145 (see FIG. 2, FIG. 3 and FIG. 4) is typically operated at, for example, 1–250 torr. As noted, the exterior of heater 150 is exposed to the reaction condition inside chamber 145. At the same time the exterior surfaces of heater 150 are exposed to this vacuum, the interior portions of heater 150 are protected from the environment in chamber 145. Thus, for example, conductive leads 215a, 215b, 220a and 220b and thermocouple 210 are protected from the environment in chamber 145 by being placed in the opening or conduit through shaft 158 and into the body of susceptor 155. In one embodiment, the pressure in the opening or conduit through shaft 158 is not subject to the vacuum that might be present in chamber 145. Instead, the opening or conduit through shaft 158 is at atmospheric pressure. Therefore, the step motor that moves heater 150 (e.g., up and down) and lift plate 190 in chamber 145 is sized to move against the vacuum force in the chamber. Thus, one advantage of the heater configuration of the invention is that the components protected from the chamber environment in heater 150 may be nested together so that the diameter of the shaft is not too large, and the volume inside shaft 158 is not too great, to place unreasonable demands on the motor that will move heater 150 (e.g., up and down) inside chamber 145. Placing the heating elements (e.g., first heating element 250 and second heating element 260) in separate planes of the body of susceptor 155 allows such nesting. The nesting also minimizes heat loss in the system through the opening or conduit in shaft 158.

Figure 5:
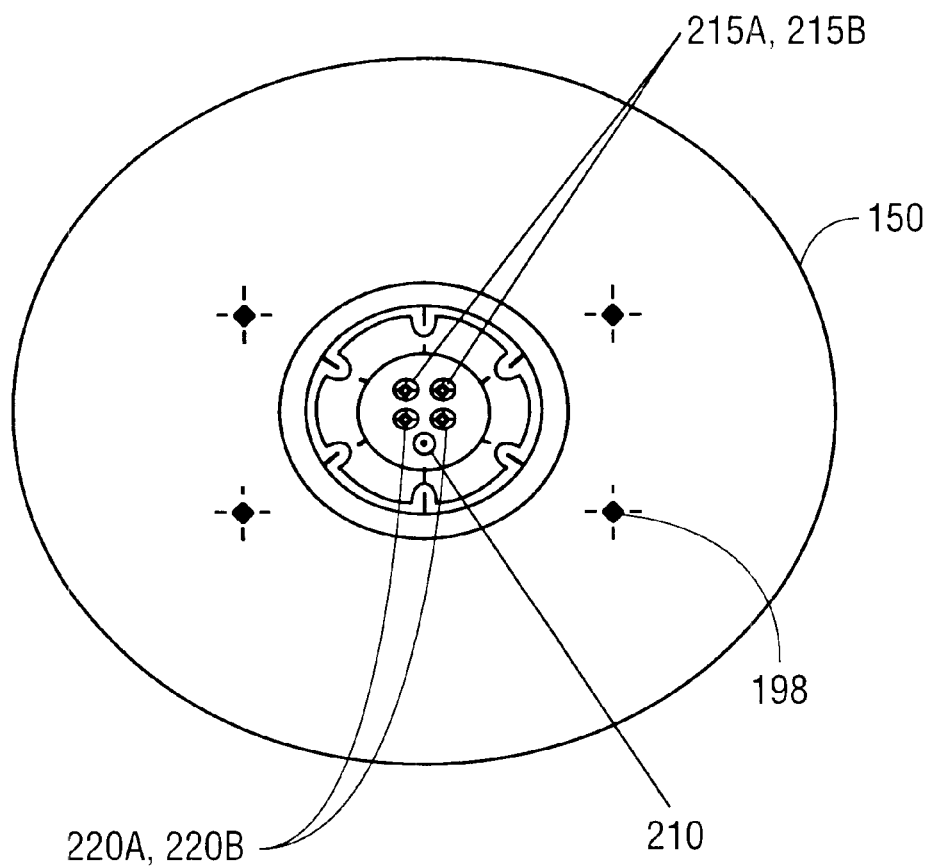
FIG. 5 is a bottom view of the heater of the CVD system taken in accordance with an embodiment of the invention.

FIG. 5 shows a view of an embodiment of the heater of the invention through the base of shaft 158. From this view, the individual conductive leads 215a and 215b for first heating element 250 and 220a and 220b for second heating element 260 are shown nested together in the center of susceptor 155. Also shown nested with conductive leads 215a, 215b, 220a, and 220b is thermocouple 210. As can be seen by this illustration, the diameter of shaft 158 of heater 150 may be minimized to, in this instance, approximately one third of the diameter of susceptor 155. FIG. 5 also shows four openings or throughbores 198 in the body of susceptor 155. Openings or throughbores 198 support lift pins 195 that are used to, for example, raise and lower a wafer onto the superior surface of susceptor 155.

Figure 6:
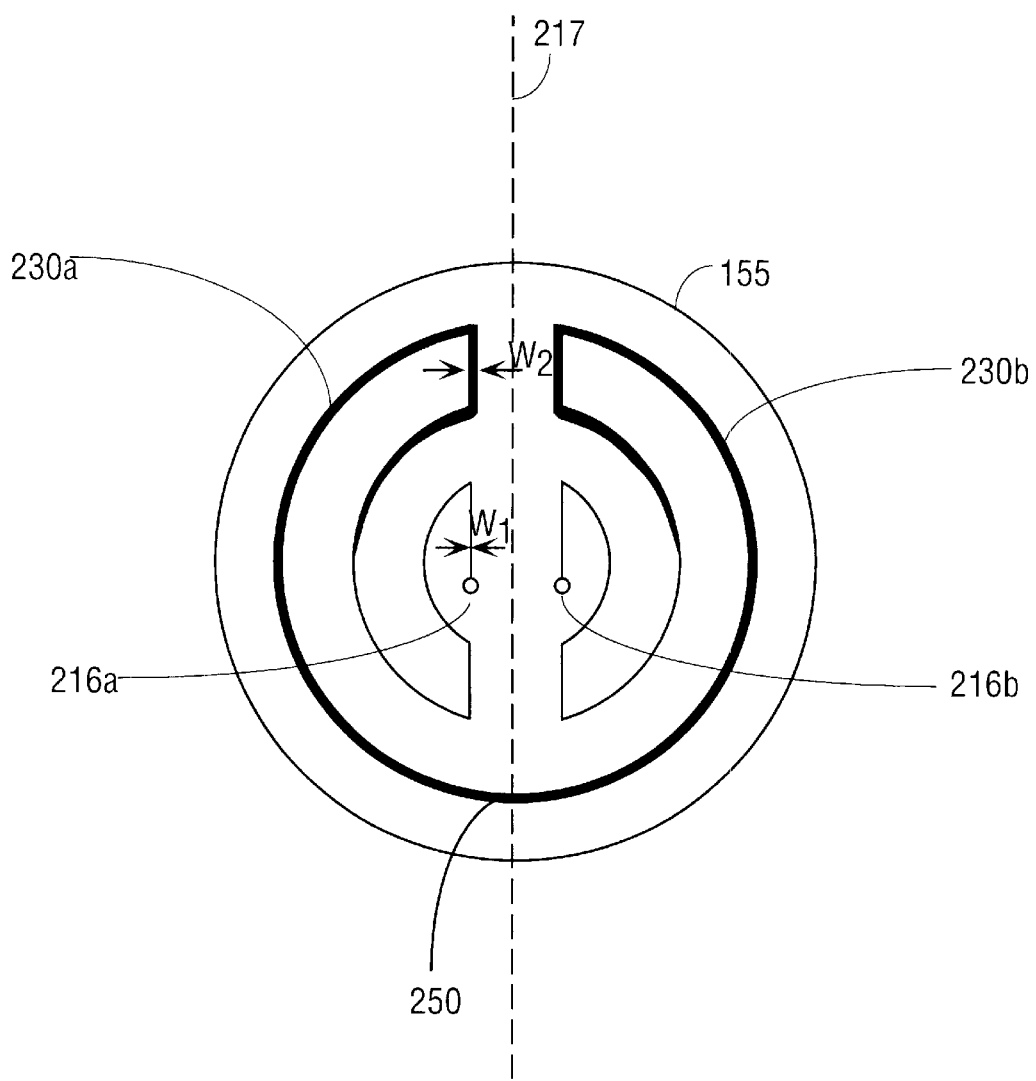
FIG. 6 is a top view of the stage or susceptor of the heater of the CVD system taken through line A—A of FIG. 4 in accordance with an embodiment of the invention.

FIG. 6 shows a top cross-sectional view of susceptor 155 through line A—A of FIG. 4. In this figure, first heating element 250 is shown formed in the plane defined by line A—A of FIG. 4. First heating element 250 is, for example, comprised of two opposing coil portions 230a and 230b set forth in a mirror-image like fashion.

Coil portions 230a and 230b of first heating element 250 are formed in the body of susceptor 155 in the plane defined by lines A—A of FIG. 4. Coil portions 230a and 230b of first heating element 250 are coupled to terminals 216a and 216b, respectively, to connect the coil portions to a power source through conductive leads 215a and 215b, respectively. Coil portions 230a and 230b are, for example, of a material compatible with the current demand of the power source and the temperature ranges for the heater. Coil portions 230a and 230b are also selected, in one embodiment, to be of a material with thermal expansion properties similar to aluminum nitride. As noted, a molybdenum (Mo) material having a thickness of approximately 2 mils formed in an aluminum nitride (AlN) stage or susceptor is capable of generating susceptor temperatures (when coupled to an appropriate power supply) in excess of 750° C. In one embodiment, opposing coil portions 230a and 230b are separated at terminals 216a and 216b by approximately 3–5 mm. The distance between the coil portions can be reduced to reduce any effective "cold zone" between the coil portions.

Figure 7:
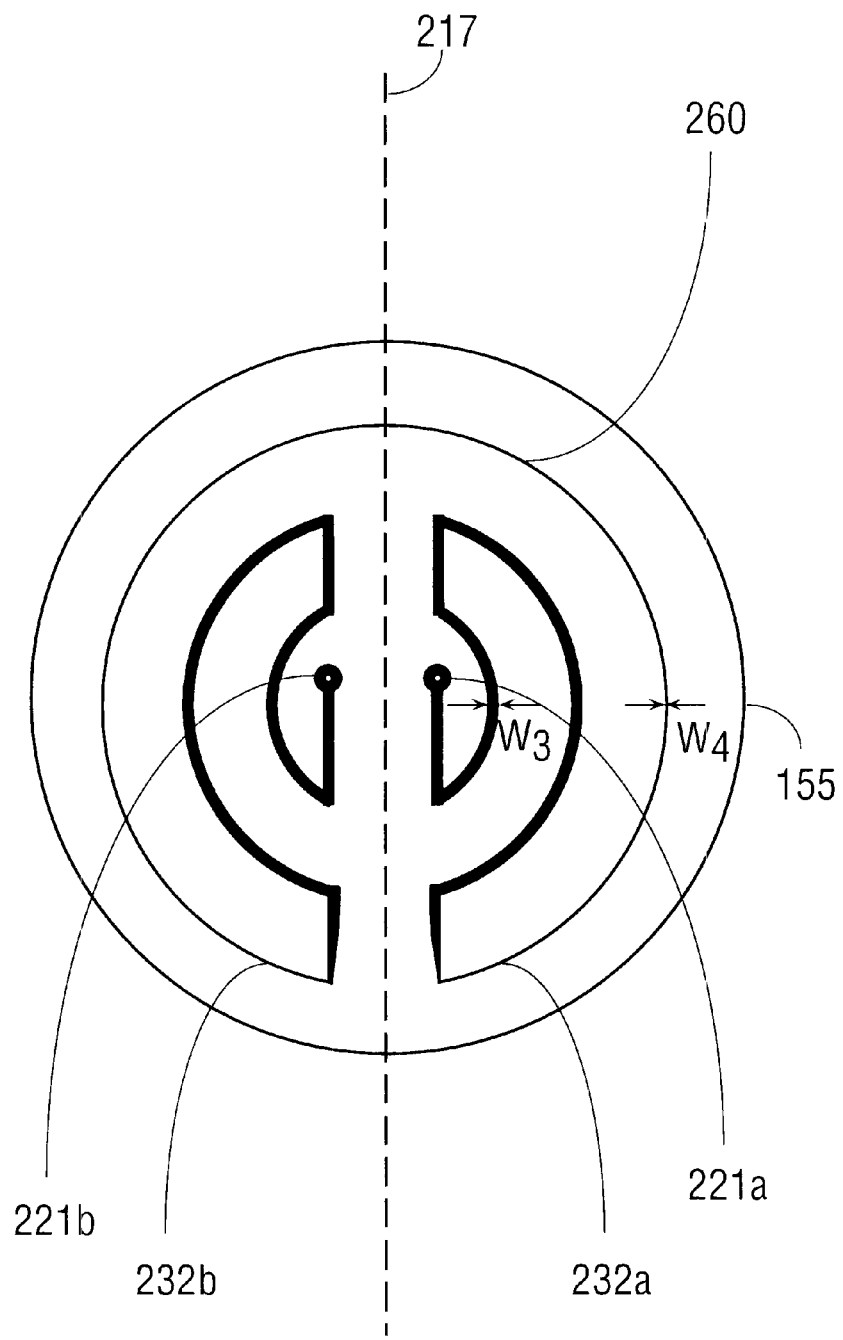
FIG. 7 is a top view of the stage or susceptor of the heater of the CVD system taken through line B—B of FIG. 4 in accordance with an embodiment of the invention.

FIG. 7 shows a cross-sectional top view of susceptor 155 taken through lines B—B of FIG. 4. FIG. 7 illustrates the plane of second heating element 260. In this embodiment, second heating element 260 is formed in the body of susceptor 155 at a position further from the surface of susceptor 155 than first heating element 250 (i.e., the plane defined by lines A—A is nearer the surface of susceptor 155 than the plane defined by lines B—B). Similar to FIG. 6, second heating element 260 comprises opposing coil portions 232a and 232b of, for example, molybdenum (Mo) formed in a mirror image fashion in the plane defined approximately by lines B—B. Coil portions 232a and 232b of first heating element 232 are coupled to terminals 221a and 221b, respectively, to connect the coil portions to a power source through conductive leads 220a and 220b. In one embodiment, opposing coil portions 232a and 232b are separated at terminals 221a and 221b by approximately 3–5 mm. The distance can be reduced to reduce any effective "cold zone" between the coil portions.

In the embodiment illustrated in FIG. 6 and FIG. 7, coil portions 232a and 232b of second heating element 260 oppose one another in FIG. 7 about axis 217 and coil portions 230a and 230b of first heating element 250 oppose one another in FIG. 7 about a similar axis. A comparison of the figures shows that coil portions 232a and 232b are rotated 180° relative to coil portions 230a and 230b. In this manner, an area between opposing coil portions in either first heating element 250 or second heating element 260 is compensated by the other heating element. It is to be appreciated that the configuration of heating element coils need not be offset by 180° as illustrated. Instead, the heating element coils may, for example, lie directly over one another (i.e., no compensation) or may overlap one another at a variety of angles to compensate in some fashion the area between the opposing coil portions.

Figure 8:
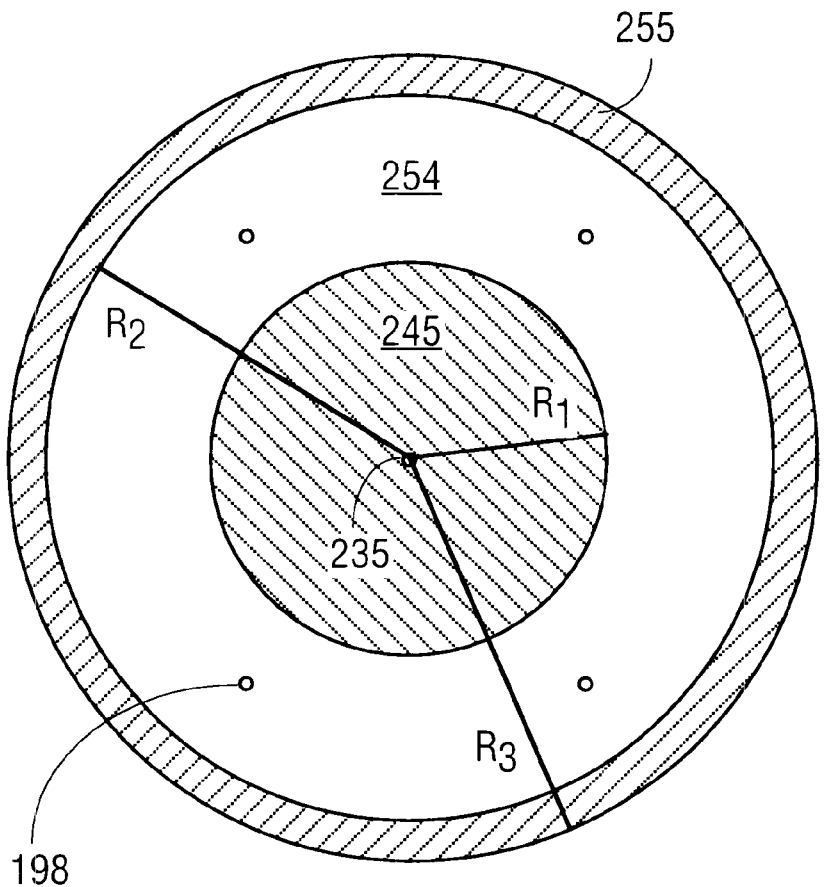
FIG. 8 is a top schematic view of the stage or susceptor of the heater of the CVD system showing three zones in accordance with an embodiment of the invention.

FIG. 8 shows a schematic top view of susceptor 155. The surface of susceptor 155 is divided into at least three zones. As shown in FIG. 8, area 245 forms a zone having an area defined by radius $R_1$. Area 245 is associated with an area of susceptor 155 above shaft 158. Area 254 forms a zone having an area defined by radius $R_2$ minus area 245 defined by radius $R_1$. Area 255 is associated with the edge of susceptor 155 and forms a zone having an area defined by a radius $R_3$ minus area 254 defined by radius $R_2$ and area 245 defined by radius $R_1$.

In one embodiment, first heating element 250 and second heating element 260 have independent heat distribution and therefore may be controlled separately. In this manner, first heating element 250 may receive more or less power at certain points than certain points of second heating element 260. It is also to be appreciated at this point, that additional heating elements may be added in the body of susceptor 155 to further define additional heating zones in the resistive heater. Considerations for incorporating multiple heating elements include locations in planes of susceptor 155 and nesting of additional conductive leads.

One way first heating element 250 and second heating element 260 are separately controlled is by varying the width of each heating element across the area of the susceptor 155 while keeping the thickness of the heating element generally constant. It is generally recognized that, for a resistive heater, the power supplied to the heating element, and thus the heat given off by the heating element, is directly related to the resistance in the heating element. For a resistive heating element having a constant thickness, a wider portion of the heating element (i.e., greater volume) will have less resistance, will require less power to move a current, and will give off less heat than a narrower portion of the heating element (i.e., smaller volume). Thus, by reducing the width of a heating element at certain points (i.e., reducing the volume of the heating element), the power supplied to the heating element will be greater at those points to move an amount of current through the heating element than at points where the width of the heating element is not reduced. The temperature given off at the reduced points will similarly be greater than at points where the width of the heating element is not reduced. In turn, the power density, defined generally as the amount of power required to move an amount of current through a length of a heating element, will be greater at those portions of the heating element having a reduced width.

In FIG. 6, first heating element 250 is, for example, a molybdenum (Mo) material having a thickness of approximately 2 mils. The width of first heating element 250 varies, in this example, to localize the power distribution to first heating element 250 in area 245 (see FIG. 8). Area 245 is defined, in this example, to encompass an area above shaft 158. In one embodiment, where an opening is formed through shaft 158 to accommodate thermocouple 210 and conductive leads 215a, 215b, 220a, and 220b, heat loss at an area of susceptor 155 will be greater over an area of susceptor 155 associated with an area above shaft 158, denoted area 245. Thus, the power density associated with area 245 in that portion of heating element 250 will be greater than the power density associated with area 255 in that portion of heating element 250.

Referring to FIG. 6 and FIG. 8, in one example, a width, $W_1$, of first heating element 250 in an area corresponding to area 245 (see FIG. 8) is less than a width, $W_2$, corresponding to area 255 (see FIG. 8) of susceptor 155 of heater 150. Current traveling through the smaller width $W_1$ portion of first heating element 250 will encounter a greater resistance than current traveling through other portions of heating element 250 (e.g., width $W_2$), and thus the heat given off by heating element 250 will be greater in area 245. For a molybdenum (Mo) material heating element having a thickness of 2 mils, the width $W_1$, may be, for example, 10 percent or less of the width $W_2$, to increase the power density to area 245 relative to area 255. In one embodiment of a molybdenum material, the resistance throughout first heating element 250 varies between a value of 2 ohms (e.g., width $W_2$) to a value of 4 ohms (e.g., width $W_1$).

Referring to FIG. 7 and FIG. 8, area 255 is defined, in this example to encompass an area corresponding to the edges of susceptor 155. In one embodiment, heat loss of an area of the surface of susceptor 155 will be greater at its edges, denoted area 255. Thus, for example, the power density associated with area 255 in that portion of heating element 260 will be greater than the power density associated with other areas of susceptor 155.

Referring to FIG. 7 and FIG. 8, second heating element 260 is, for example, a molybdenum (Mo) material having a thickness of approximately 2 mils. The width of second heating element 260 varies, in this example, to localize the power density to second heating element 260 in area 255 (see FIG. 8). Thus, a width, $W_4$, of second heating element 260 in an area corresponding to area 255 (see FIG. 8) is less than a width, $W_3$, corresponding to other areas of susceptor 155 of heater 150. Current traveling through the smaller width $W_4$ portion of heating element 260 will encounter a greater resistance than current traveling through other portions of heating element 260 (e.g., width $W_3$), and thus the heat given off by heating element 260 will be greater in area 255. For a molybdenum (Mo) material heating element having a thickness of 2 mils, the width, $W_4$, may be, for example, 10 percent or less of the width, $W_3$, to increase the power distribution to area 255 relative to area 245. In one embodiment of a molybdenum material, the resistance throughout first heating element 250 varies between a value of 2 ohms (e.g., $W_3$) and 4 ohms (e.g., $W_4$).

Figure 9:
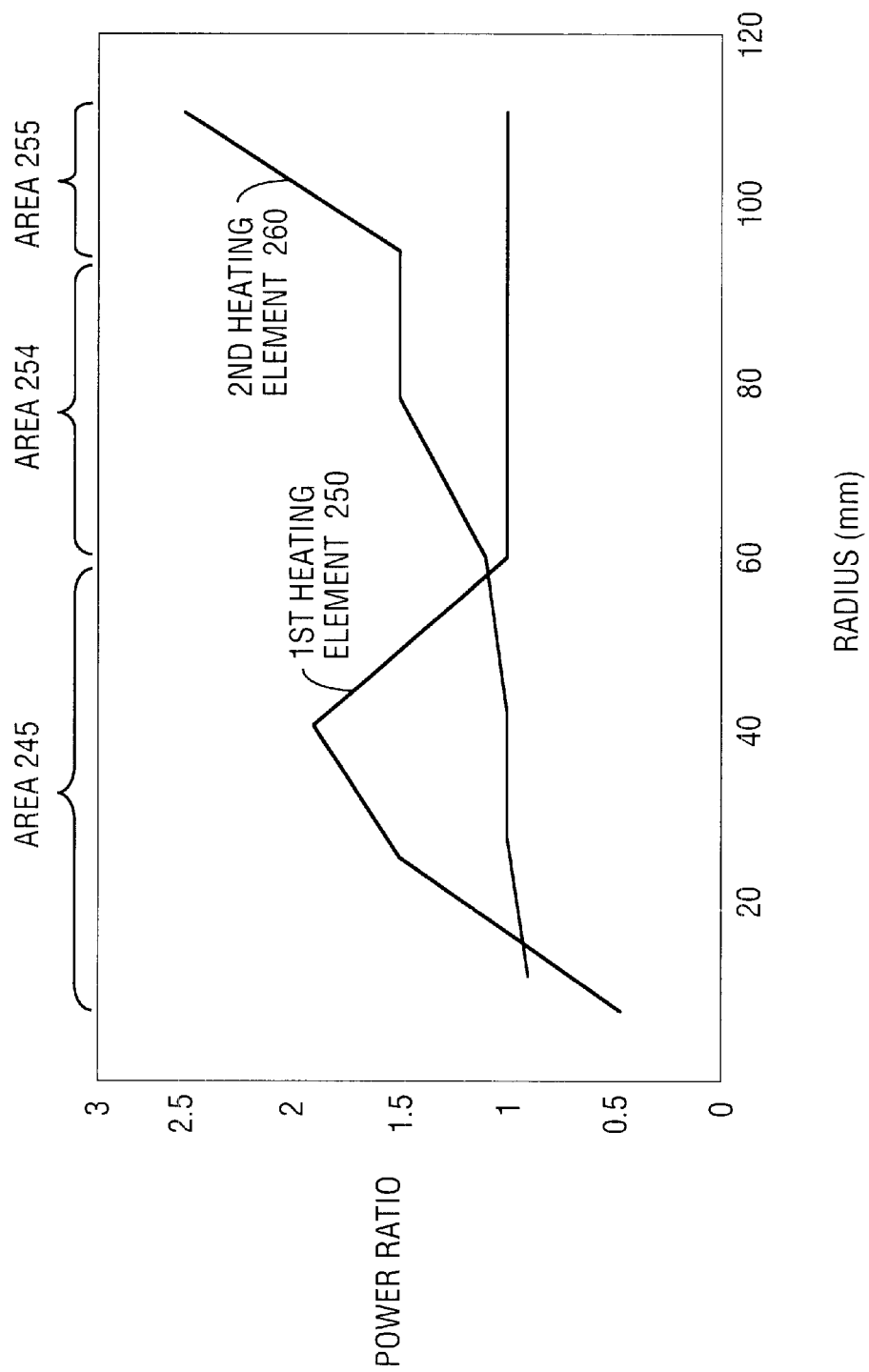
FIG. 9 is a graphical representation of the power ratio versus the stage or susceptor radius of a heater in accordance with an embodiment of the invention.

FIG. 9 graphically illustrates the individual control of the heating elements for the surface of susceptor 155 of heater 150. FIG. 9 shows the power ratio supplied to the first heating element and the second heating element versus the radius of the susceptor 155. The power ratio is defined in this embodiment as the ratio of power of first heating element 250 and the power of second heating element 260. As indicated, the power ratio of first heating element 250 is greater in area or zone 245 than other zones of susceptor 155 due to the additional power supplied to first heating element 250. Similarly, the power ratio is greater in area or zone 255 due to the additional power supplied to second heating element 260 in that area or zone than other areas of susceptor 155.

A multi-zone resistive heating element such as illustrated in FIGS. 4–8 allows individual areas or zones of a susceptor of a heater to be separately addressed, thereby providing more temperature uniformity across the surface of the susceptor than single-zone resistive heaters. For example, a dual-zone resistive heater such as shown in FIGS. 4–8 allows a first zone (area 245) to be addressed individually of other areas of susceptor 155. Thus, heat loss through shaft 158 may be accommodated without sacrificing temperature uniformity across the surface of susceptor 155. Similarly, a second zone (area 255) may be addressed individually of other areas of susceptor 155. Thus, heat loss at the edges of susceptor 155 (even at temperatures of 750° C. or more) may be accommodated without sacrificing temperature uniformity across the surface of susceptor 155. Thus, for high temperature applications (e.g., approximately 750° C. or more), the separate areas may be controlled so that heat loss, for example, at an area associated with shaft 158 and the edges of susceptor 155 may be compensated by increased power distribution to first area 245 and second area 255. The temperature across the surface of susceptor 155 may therefore be maintained at a more constant value than prior art single zone resistive heaters.

In FIGS. 4–8, first heating element 250 and second heating element 260 occupy approximately the same area of susceptor 155. One advantage of such a configuration is that, in the event that one heating element fails, the other heating element may be configured to heat the entire surface of susceptor 155. It is to be appreciated that the individual heating elements need not occupy similar areas of susceptor 155, but may be configured to occupy only specific areas such as area 245 or area 255.

In FIGS. 4–8, first heating element 250 is located in the plane (represented by lines A—A of FIG. 4) closer to the superior surface of susceptor 155 than the plane of second heating element 260 (represented by lines B—B of FIG. 5). In one embodiment, first heating element 250 is approximately 5–8 mm from the surface of susceptor 155. Separating first heating element 250 from the surface in this manner provides better temperature distribution and decreases localized heating.

It is to be appreciated that the placement of the respective heating elements will vary according to the process conditions and the process objectives. One reason for placing second heating element 260 in a plane of the body of susceptor 155 lower than a plane associated with first heating element 250 is that the power supplied to second heating element 260 may be greater than that supplied to first heating element 250. Such a situation will occur when, for example, the heat loss at the edges of the surface of susceptor 155 is greater than the heat loss at the center of surface of susceptor 155. Accordingly, the additional power (e.g., higher power density) supplied to the edges of susceptor 155 as compared to the center of susceptor 155 can, in one instance, be distributed better as a result of the greater difference between the location of second heating element 260 (denoted by lines B—B) and the surface of susceptor 155 than if that heating element was located in a plane closer to the surface of susceptor 155. The better distribution reduces the potential for localized heating or "hot spots" providing a more uniform distribution of the heat at the surface of susceptor 155. By distributing the heat more uniformly through the location of second heating element 260, the ability to control the temperature of the surface of susceptor 155 to, for example, ±3° C. even at temperatures of 750° C. or greater at any particular spot is facilitated. The more even distribution also reduces the likelihood of susceptor cracking or damage.

Figure 10:
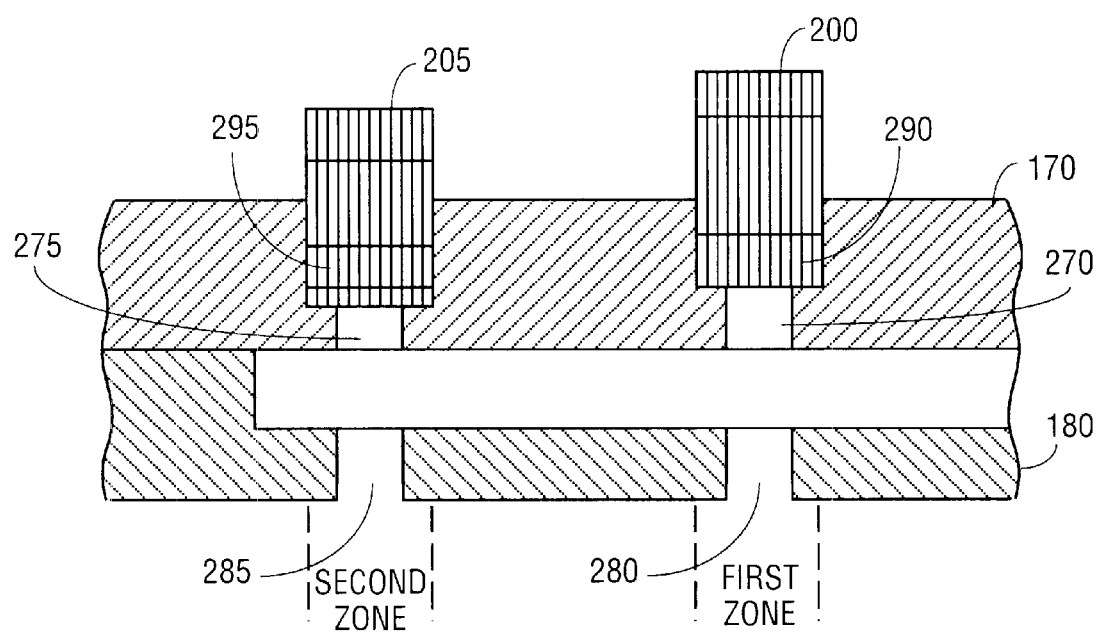
FIG. 10 is an expanded cross-sectional view of a portion of the CVD system showing two pyrometers coupled to a top portion of the chamber wall in accordance with an embodiment of the invention.
Figure 11:
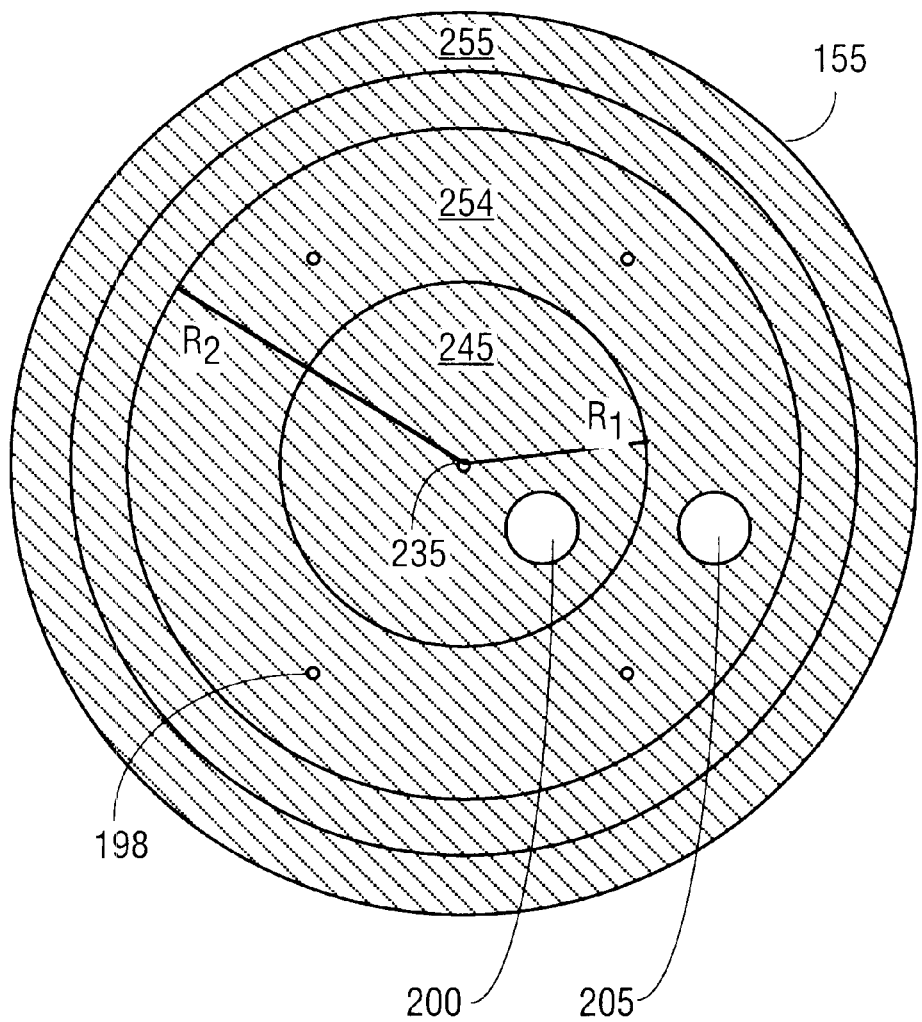
FIG. 11 is a top view of the chamber of the CVD system showing two pyrometers above respective heating zones in accordance with an embodiment of the invention.

FIGS. 10 and 11 illustrate one embodiment for monitoring or indicating the temperature of the surface of susceptor 155.

FIG. 10 schematically shows a portion of the top surface of the chamber body, specifically, a portion of chamber lid 170 and a portion of perforated face plate 180. Extending through openings in chamber lid 170 are two pyrometers, first pyrometer 200 and second pyrometer 205. FIG. 11 shows a top view of chamber lid 170 having first pyrometer 200 and second pyrometer 205 coupled thereto. First pyrometer 200 and second pyrometer 205 are, for example, available from Sekidenko, Inc. of Vancouver, Wash. Each pyrometer provides data about the temperature at the surface of susceptor 155 (or at the surface of a wafer on susceptor 155). In one embodiment, each pyrometer has a temperature measurement range of 335° C. to 1200° C. Each pyrometer measures the temperature of susceptor 155 in an area corresponding to the location of the pyrometer. In the example shown in FIG. 11, first pyrometer 200 measures a temperature of susceptor 155 in area or zone 245 while second pyrometer 205 measures a temperature of susceptor 155 in area or zone 254. Thermocouple 210 measures the temperature at a surface of susceptor 155 corresponding approximately or near to center 235 of susceptor 155. It is to be appreciated that the pyrometers and thermocouple are exemplary and other devices may be used as temperature indicators. For example, thermal cameras may be substituted for the pyrometers in another embodiment of the invention.

Since first pyrometer 200 and second pyrometer 205 provide a temperature measurement based in part on the radiant energy or light to which the pyrometer is exposed, each pyrometer must have access to the inside of chamber 145. Access, in this case, is provided by windows 290 and 295 at the base of first pyrometer 200 and second pyrometer 205, respectively, and openings 270 and 275 formed in chamber lid 170, respectively, and openings 280 and 285, respectively, formed in face plate 180. In certain embodiments, such as a CVD deposition process, there may be a concern about the possible coating of windows 290 and 295, that might disrupt the available radiation or light to first pyrometer 200 and second pyrometer 205, respectively, causing the temperature measurement of the pyrometers to fail. Accordingly, in one embodiment, the length and width, particularly of openings 280 and 285 but also possibly of openings 270 and 275 are configured to minimize the possibility of coating windows 290 and 295. In one embodiment, the ratio of the openings is related to the thickness of faceplate 180. A suitable relation for openings to faceplate thickness is 1 to 3.

In one embodiment, the multiple temperature measurements are used to regulate and control the temperature of the surface of susceptor 155. For example, in an LPCVD process for the deposition of $Si_3N_4$, a surface reaction temperature of 750° C. may be desired with a ±2.5° C. temperature difference across the surface of susceptor 155 of heater 150. The system of the invention may regulate and control the temperature of heater 150 by measuring a temperature at midpoint 235 of susceptor 155 (measured, in this embodiment, by thermocouple 210) which is used as a reference temperature or control temperature. The temperature uniformity across susceptor 155 is measured by the temperature difference of first pyrometer 200 and second pyrometer 205, ΔT. From the measured ΔT, the system will adjust the power ratio of the first heating element and the second heating elements to control the ΔT in a certain range, such as ±2.5° C. at 750° C. for a $Si_3N_4$ LPCVD process. The advantages of using a temperature difference (e.g., ΔT) measurement are at least two fold. First, emissivity changes between wafers will effect the absolute measurement of each pyrometer, but will not effect the relative value of ΔT.

Second, changes in the condition of the chamber over time will not effect the relative temperature measurement but generally will effect the absolute temperature measurement.

Figure 12:
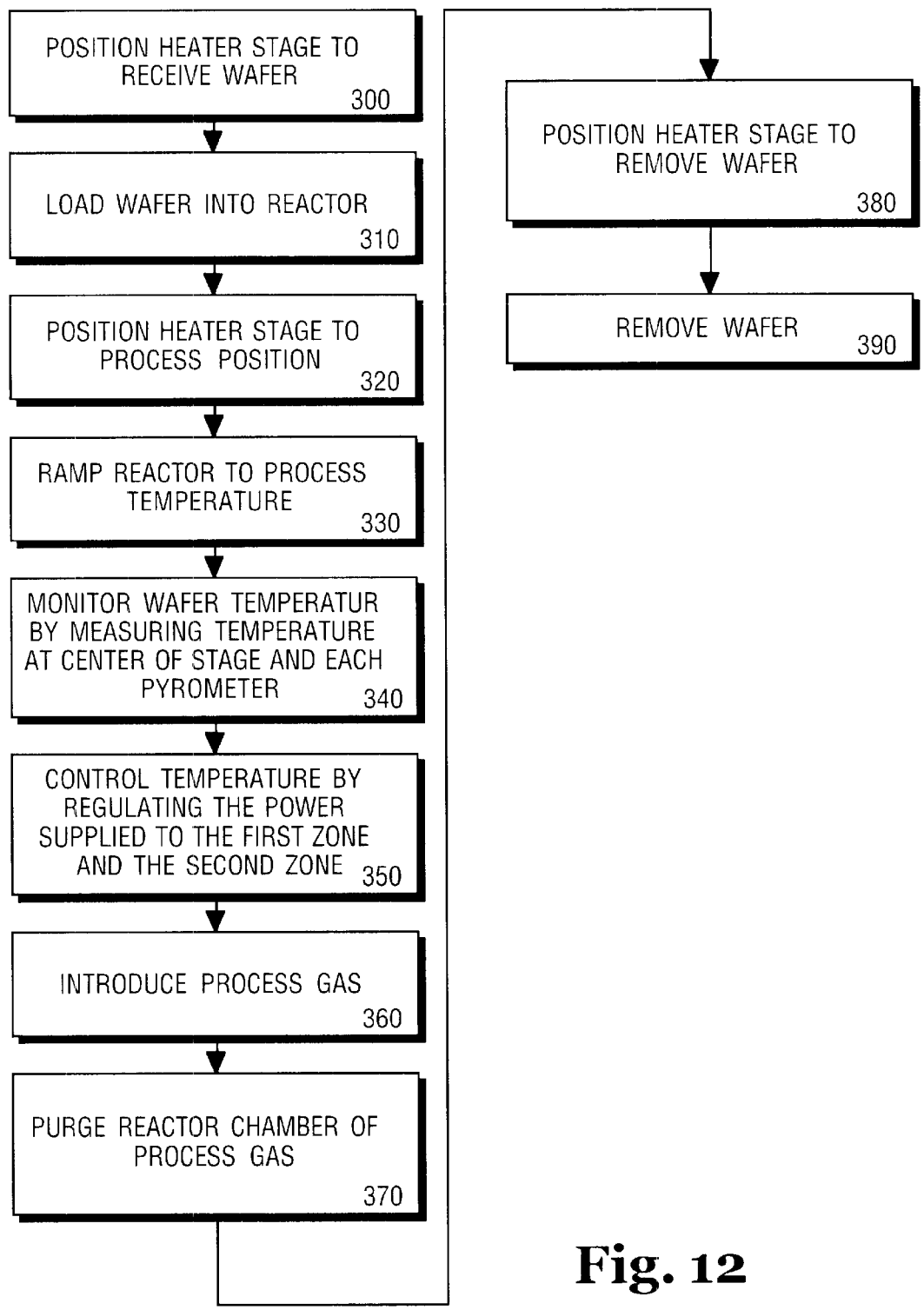
FIG. 12 is a flow chart of a method of processing a wafer in a CVD chamber according to an embodiment of the invention.

FIG. 12 describes a general method of processing a wafer in a reactor configured according to an embodiment of the invention. FIG. 12 describes a method of controlling the temperature in a dual-zone, single-wafer, resistive heater during, for example, a CVD process. As a first step (step 300), heater 150 in chamber 145 of a CVD reactor is placed in a wafer-load position (see FIG. 3 and the accompanying text). Next, a wafer is loaded onto susceptor 155 using, for example, a robotic transfer mechanism (step 310). Heater 150 is then positioned so that the wafer is adjacent perforated face plate 180 (step 320) as illustrated, for example, in FIG. 1. The reactor is then ramped to process temperature (step 330). In an LPCVD process for the deposition of $Si_3N_4$, for example, the temperature is ramped to 750° C. The temperature is measured at thermocouple 210 and one or both of first pyrometer 200 and second pyrometer 210 to coordinate the temperature across the surface of susceptor 155 of heater 150 (step 340). The temperature is controlled by regulating the power supply to first heating element 250 and second heating element 260 (step 350).

Once the reaction is complete and the desired film thickness is achieved, the process gas supplied to the chamber is discontinued and the chamber is purged with an inert gas such as nitrogen (step 370). Next, the heater stage is moved to the wafer-load position (see FIG. 3 and the accompanying text) and the processed wafer is removed and replaced by another wafer (step 380).

The above description related to controlling the temperature of the surface of susceptor 155 of heater 150 and thus the surface reaction temperature of a wafer on the surface of susceptor 155 by controlling and regulating the temperature in different areas or zones of susceptor 155. It is to be appreciated that this control and regulation may be done manually or with the aid of a system controller. In the former instance, an operator may record temperature measurements of the different temperature indicators (e.g., first pyrometer 200, second pyrometer 205, and thermocouple 210) and manually adjust the power supplied to either or both first heating element 250 and second heating element 260. Alternatively, a controller may be configured to record the temperature measured by the temperature indicators and control the power supplied to the heating elements based, for example, on an algorithm that determines a relative value of the temperature difference and adjusts the heating elements accordingly.

Figure 13:
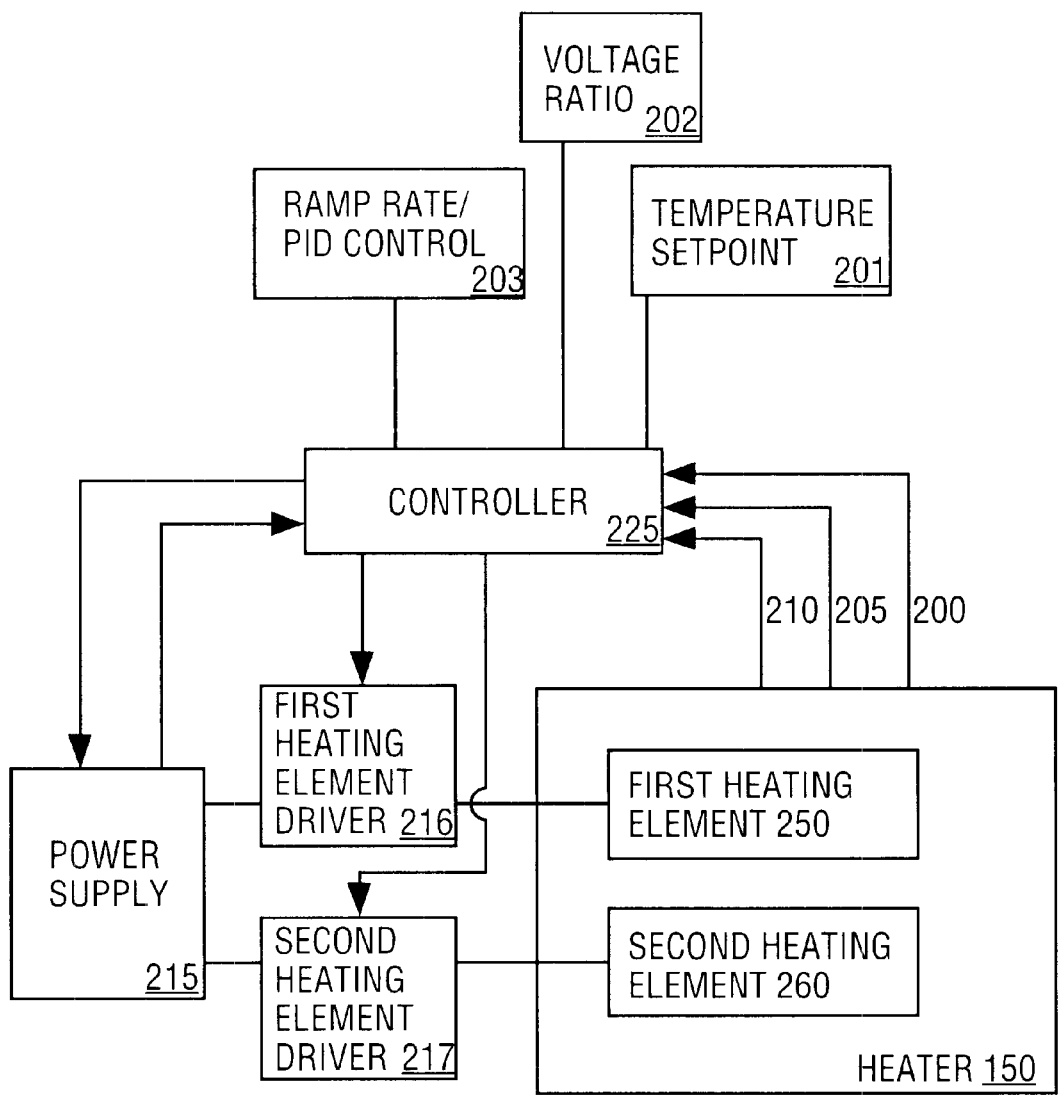
FIG. 13 is a block diagram of an embodiment of the system of the invention having a controller to control the power supplied to heating elements of the heater.

FIG. 13 schematically illustrates a system for controlling first heating element 250 and second heating element 260 based on temperature measurements provided by indicators such as, for example, first pyrometer 200, second pyrometer 205, and thermocouple 210, provided to controller 225. In one embodiment, controller 225 contains a suitable algorithm to compare the temperature difference of at least two of the temperature indicators and control power supply 215 to coordinate the temperature of heater 150 so that the temperature indicators are within acceptable ranges. For example, in the example where the temperature of heater is desired to be 750° C.±2.5° C. across the surface of susceptor 155 of heater 150, controller 225 controls power supply 215 to achieve this result based on measurements provided by at least two indicators.

Controller 225 is supplied with software instruction logic that is a computer program stored in a computer readable medium such as memory in controller 225. The memory is, for example, a portion of a hard disk drive. Controller 225 may also be coupled to a user interface that allows an operator to enter the reaction parameters, such as the desired reaction temperature and the acceptable tolerance of a temperature difference between indicators (e.g., ±3° C.). In an LPCVD reaction process, controller 225 may further be coupled to a pressure indicator that measures the pressure in chamber 145 as well as a vacuum source to adjust the pressure in chamber 145.

Generally, heater element control takes place by either voltage or current regulation. The power output of the heater element is equivalent to, by voltage $$Power = voltage^2/resistivity.$$

In FIG. 13, controller 225 is supplied with a desired operating temperature (provided by temperature set point 201). Controller 225 controls power supply 215 which supplies the necessary voltage to first heating element driver 216 and second heating element driver 217. The heating element drivers in turn control the voltage applied to first heating element 250 and second heating element 260, respectively. Controller 225 controls the ramp rate of heater 150 and the voltage or power ratio of heater 150 (ramp rate/PID control 203 and voltage ratio 202, respectively).

The following describes an embodiment of multiple zone heater control using, for example, the system described in FIG. 13. Multiple zone heater temperature is controlled with one temperature sensor at an inner zone (e.g., area or zone 245), while a calibrated correlation function is set between the inner zone (e.g., area or zone 245) and outer zone (e.g., area or zone 254 or area or zone 255). The temperature control adopts two methodologies. When the heater temperature is close to the set point and is within proportional plus integral derivative forward (PIDF) servo band, the PIDF control algorithm is used to regulate the heater temperature to the set point. On the other hand, when the heater is in ramping up or cooling down mode, and its temperature is out of the PIDF servo band, the ramp algorithms are used to control the heater temperature with a predefined rate of heating or cooling to prolong heater life. The dual zone heater temperature uniformity is controlled by voltage ratio or power ratio between the inner and outer zones. The ratio is not a constant, but needs to be changed as the temperature changes because the heat loss increases differently between inner and outer zones of the susceptor as heater temperature increases. The ratio setting is also dependent on the chamber condition, such as chamber pressure and gas flow.

The heater control modes can be divided into ramp control and PIDF control. The ramp control can be further divided as "low temperature ramp" and "high temperature ramp" by temperature range with different voltage or power ratios. The "low temperature ramp" adopts a fixed voltage ratio. The "high temperature ramp" adopts a varied voltage or power ratio that is calculated through formula.

I. Control Condition

The chamber operation condition can be divided into two modes: "chamber OFF line/ON line" and "recipe" operation. The operating sequences may be as follows:

A. Chamber OFF line/ON line:

When the heater starts to heat up, to set the temperature, the control steps are:

1. Low temperature ramp, when the heater temperature is under the predefined temperature.
2. High temperature ramp, when the heater temperature is over the predefined temperature.
3. PIDF servo, when the heater temperature reaches the requested temperature within the predefined servo band.

When the heater starts to cool down, the control steps are reversed:

A. High temperature ramp, when the heater temperature is over a predefined temperature.
B. Low temperature ramp, when the heater temperature is under a predefined temperature.
C. PIDF servo, when the heater temperature reaches the requested temperature within the predefined servo band.

The ramp rate and other PID factors follow predefined system constants.

B. Recipe Operation:

In recipe operation, the heater control contains the temperature control requirement parameters: temperature setting, voltage ratio, and ramp rate (if the temperature required is different from previous step).

For a clean recipe, the control sequence is for example:
33. PIDF servo at process temperature.
34. Ramp down to clean temperature.
35. PIDF servo at clean temperature.
36. Ramp up to process temperature.
37. PIDF servo at process temperature.

During the PIDF servo, the voltage ratio is listed in step of recipe. During the ramp up or down, the ramp rate is listed in step of recipe and the voltage ratio follows the predefined value as used in "chamber OFF line/ON line."

II. Ramp Control

One algorithm used for ramp control is described in the below equations which use proportional control on the ramp rate of the heater temperature.

Heater Ramp Voltage:

Inner Zone Heater Ramp Voltage=Previous Inner Zone Heater Ramp Voltage +([Ramp P Gain]*(Target Ramp Rate−Actual Ramp Rate))

Outer Zone Heater Ramp Voltage=Voltage Ratio*Inner Zone Heater Ramp Voltage

When Outer Zone Heater Ramp Voltage>100% (e.g., 10V), let
Outer Zone Heater Ramp Voltage=100% (e.g., 10V) and Inner Zone Heater Ramp Voltage=Outer Zone Heater Ramp Voltage/Voltage Ratio Target Ramp Rate is heater temperature ramp rate in Online/Offline, and Target Ramp Rate can be overwritten by "Ramp Rate" in "Clean" recipe. Table 1 presents a description of each parameter in the above equations and provides a representative recommended value for an LPCVD chamber.

TABLE 1

Heater Parameter Description-Ramp Control

Inner Zone Heater Power Output Ramp Rate (Limitation of Change of Ramp Rate)

| | |
|---|---|
| Description: | Maximum rate at which analog output from system controller can change. |
| Recommended Value: | 100 mV |

Temperature Error to Switch to PID Control

| | |
|---|---|
| Description: | Temperature band at which to switch from ramp control to PID control and vice versa. |
| Recommended Value: | 10° C. |

TABLE 1-continued

Heater Parameter Description-Ramp Control

Temperature Ramp Proportional Gain (Ramp P Gain)

| | |
|---|---|
| Description: | Proportional Gain used to calculate heater voltage during ramp control. |
| Recommended Value: | 8 |

Chamber X Heater Temperature Ramp Rate
Heater Temperature Ramp Rate (Target Ramp Rate)

| | |
|---|---|
| Description: | Rate at which temperature should rise or fall. |
| Recommended Value: | 0.15° C./Sec |

Voltage Ratio

| | |
|---|---|
| Parameter: | |
| Description: | Voltage ratio between outer zone and inner zone at control temperature. This parameter varies for different temperatures. See "Voltage Ratio" section for detail. |

Thermocouple Failure Detection Time-out

| | |
|---|---|
| Description: | Time to signal an alarm if the actual ramp rate is less than 70% of the target ramp rate. |
| Recommended Value: | 300 seconds |

For Ramp Control, the voltage ratio depends on the heater temperature range.

A. If Current temperature (° C.)<[$T_L$]:
   then Voltage Ratio=[$R_L$]
   Note: $R_L$=Voltage Ratio of Low Temperature Ramp
   $T_L$=Temperature Limit of Low Ramp (° C.)

B. If [$T_L$]<Current Temperature (° C.)<Setting Temperature (° C.)−[Temperature Error to Switch PID Control] then Voltage Ratio=[$R_L$]+([$R_H$]−[$R_L$])*(Current temperature−[$T_L$])/([$T_H$]−[$T_L$])
   Note: $R_L$=Voltage Ratio of Low Temperature Ramp
   $R_H$=Voltage Ratio of High Temperature Ramp
   $T_H$=Temperature Limit of High Ramp (° C.)
   $T_L$=Temperature Limit of Low Ramp (° C.)
   $R_L$, $R_H$ are limited by Maximum Voltage Ratio of Two Zones ($R_M$)

C. In Recipe (process and clean):
   The Voltage Ratio depends on the desired heater temperature range.
   At Process Temperature:
   Voltage Ratio=Voltage Ratio at Process Temperature in the recipe.
   When heater temperature ramp down or up before each Request Temperature (° C.) in recipe−[Temperature Error to Switch PID Control].
   Voltage Ratio=[$R_L$]+([$R_H$]−[$R_L$])*(Current temperature−[$T_L$])/([$T_H$]−[$T_L$])
   Note: $R_L$=Voltage Ratio of Low Temperature Ramp
   $R_H$=Voltage Ratio of High Temperature Ramp
   $T_H$=Temperature Limit of High Ramp (° C.)
   $T_L$=Temperature Limit of Low Ramp (° C.)
   $R_L$, $R_H$ are limited by Maximum Voltage Ratio of Two Zones ($R_M$)

Recalculated Voltage Ratio by every 10° C. temperature change.

III. PIDF Control

PIDF control is used when the heater temperature is within the temperature band set by the system. Within the PIDF control band, up to five different parameters are used to calculate the total heater voltage. These five parameters are feedforward, temp preset, P, I, and D. The feedforward leg provides the voltage necessary to sustain the temperature at a certain setpoint. When there is no load, it should be the only component contributing to the total heater voltage. One purpose of adding feedforward is to provide control stability for different heaters whose resistance may vary. The temp preset is available in process recipes to provide an instantaneous voltage change to the heater when large loads may be present on the heater during gas introduction or pressure ramp. The P leg is determined by multiplying the temperature error by a gain, the I leg is determined by multiplying the total temperature error by a gain, and the D leg is determined by multiplying the temperature error slope by a gain. The I leg is used only near steady state conditions when the temperature is near the setpoint. The I leg is not used in the total voltage calculation when temp preset is used during process.

Inner zone heater voltage during PIDF control is determined according to the equations in Table 2. The D leg is subtracted from the total voltage while the other legs are added. The equations for the individual legs are shown with some example calculations. The I leg and Temp Preset leg are exclusive of each other. The I leg contributes to the total voltage only when Temp Preset is zero. If the Temp Preset is not zero, the I leg is not used.

Outer zone heater voltage during PIDF control is determined by the product of the inner zone PID control output voltage and the voltage ratio (power correlation). The voltage ratio (power correlation) might be a table or listing calibrated based on real process conditions, heaters from different manufacturers, as well as hot idle conditions.

TABLE 2

PID Control Equations

Inner Zone Heater PID Voltage = (Feedforward leg + P leg + I leg + Temp Preset leg) − D leg TABLE 2-continued PID Control Equations Outer Zone Heater Voltage = Voltage Ratio*Inner Zone Heater Control Voltage
When Outer zone Heater Voltage > 100% (10 V), let Outer zone Heater Voltage = 100% (10 V)
Inner Zone Heater Voltage = Outer zone Heater Ramp Voltage/Voltage Ratio
Feedforward leg = Temperature setpoint*([Bias wattage per degree])/({Maximum Watts of Inner] + [Maximum Watts of Outer]*Voltage Ratio^2))
P leg = Temperature error*([P Gain]*[Correction Power per Degree of error]/([Maximum Watts of Inner] + [Maximum Watts of Outer]*Voltage Ratio^2))
I leg = Temperature error total*([I Gain]*[Correction Power per Degree of error]/([Maximum Watts of Inner] + [Maximum Watts of Outer]*Voltage Ratio^2))
D leg = Temperature error slope*([D Gain]*[Correction Power per Degree of error]/([Maximum Watts of Inner] + [Maximum Watts of Outer]*Voltage Ratio^2))
Temp Preset leg = [Temp Preset]/([Maximum Watts of Inner] + [Maximum Watts of outer]*Voltage Ratio^2))

EXAMPLE (Inner) Heater PID Voltage=(49.1%+3.4%+3.0%+0%)−2.0%= 53.5%=>107VAC

Feedforward leg=750*(0.655/(2000+2000*2^2)=>49.1%* P leg= 0.8*(142.7*30/(2000+2000*2^2)=>3.4%

(Outer) Heater Voltage=1.15*107=>123VAC Power Ratio=1.5

*Note: Arrows in calculations indicate that the calculated value shown is different in magnitude by a factor of $10^x$.

TABLE 3

Heater Parameter Description-PID Control

| | |
|---|---|
| Chamber X watts of power at maximum Inner analog output (maximum Watts of Inner) | |
| Description: | Used as a gain factor in calculations for Feedforward leg, P leg, I leg, D leg, and Temp Preset leg. |
| Chamber X watts of power at maximum Outer analog output (Maximum Watts of Outer) | |
| Description: | Used as a gain factor in calculations for Feedforward leg, P leg, I leg, D leg, and Temp Preset leg. |
| Chamber X resistive heater servo band width | |
| Description: | Temperature band around setpoint within which integral control is used. Integral control is reset every time temperature is outside this band. |
| Recommended Value: | 15° C. |
| Chamber X correction power per degree of error (Correction Power per degree of error) | |
| Description: | Gain factor used in P, I, and D legs. |
| Recommended Value: | 30.0 W/° C. |
| Chamber X outer zone voltage servo ratio (Voltage Ratio) | |
| Description: | Voltage ratio is used for outer zone voltage servo calibration factor based upon the inner zone PID servo value. It relates to electrical load change, i.e., current. |
| Chamber X servo by percent of error history total (I gain) | |
| Description: | Gain factor for I leg. I leg is used to correct steady state error and is used only when heater temperature is close |

TABLE 3-continued

Heater Parameter Description-PID Control to setpoint. I leg is used only when there is no temp preset in the recipe.

Chamber X servo by percent of present error (P Gain)

| | |
|---|---|
| Description: | Gain factor for P leg. P leg is used to counter any load disturbance caused b gas flow, cool wafer, etc. |

Chamber X servo by percent of present slope (D Gain)

| | |
|---|---|
| Description: | Gain factor for D leg. D leg is used to reduce oscillations in the temperature. It is subtracted from the total power and acts to oppose sudden changes in temperature. |

Chamber X heater bias wattage per degree setpoint (Bias wattage per degree)

| | |
|---|---|
| Description: | Gain factor for Feedforward leg. Feedforward leg should be tuned such that it contributes all the voltage to the total heater voltage when at hot idle (no load) |
| Recommended Value: | 0.25 W/° C. (varies from heater to heater when tuned) |

Temp Preset (Temp Preset) Programmed in Recipe

| | |
|---|---|
| Description: | Provides an instantaneous change in voltage when requested in recipe. Used during gas flow introduction when a large load is present on the heater. When temp preset is used, I leg becomes zero. Temp preset should be zero for I leg to be used, especially during deposition steps. |
| Recommended Value: | Depends on recipe. Every 50 mW of Temp Preset adds 1.8% voltage to the heater for a multiple zone heater. |

For PIDF control, the voltage ratio depends on the heater temperature range.

A. If Setting temperature (° C.) is below [TL]:

Voltage Ratio=[$R_L$]

Note: $R_L$=Voltage Ratio of Low Temperature Ramp $T_L$=Temperature Limit of Low Ramp (° C.)

B. If Setting Temperature (° C.) is between [$T_L$] and [$T_H$]

Voltage Ratio=[$R_L$]+([$R_H$]−[$R_L$])*(Setting temperature−[$T_L$])/([$T_H$]−[$T_L$])

Note: $R_L$=Voltage Ratio of Low Temperature Ramp
$R_H$=Voltage Ratio of High Temperature Ramp
$T_H$=Temperature Limit of High Ramp (° C.)
$T_L$=Temperature Limit of Low Ramp (° C.)

C. Voltage Ratio—In Recipe (process/clean):

Within Process Temperature+Temperature Error to Switch PID Control

Voltage Ratio=Voltage Ratio at Process Temperature in recipe. Voltage ratio setting is limited by Maximum Voltage Ratio of Two Zones ($R_M$).

Table 4 describes the heater parameters for heat up, standby/process, and cooling down.

TABLE 4

Heater Parameter Description-Heat up, standby/process, cooling down
Heater Parameter Description - (syscons are located in Heater Calibration Screen under Process/Chamber Parameters)
Chamber X Temperature Limit of Low Ramp (° C.) ($T_L$)

| | |
|---|---|
| Description: | When the heater is over this temperature, the voltage ratio of two zones is equal to Basic Voltage Ratio. |
| Recommended Value: | 750° C. (settable: 600° C. to 800° C.) |

Standby Temperature (° C.)

| | |
|---|---|
| Description: | When the chamber is under standby condition, the heater is maintained at this temperature. |
| Recommended Value: | Process temperature + 10° C. |

Chamber X Voltage Ratio of Low Temperature Ramp ($R_L$)

| | |
|---|---|
| Description: | Voltage ratio between outer zone and inner zone under the temperature of [Temperature Limit of Low Ramp (° C.) ($T_L$)] |

Chamber X Voltage Ratio of High Temperature Ramp ($R_H$)

| | |
|---|---|
| Description: | Voltage ratio between outer zone and inner zone equal over the temperature of [Temperature Limit of High Ramp (° C.) ($T_H$)] |

TABLE 4-continued

Maximum Voltage Ratio of Two Zones ($R_M$)

| | |
|---|---|
| Description: | The maximum voltage ratio. Includes $R_H$, $R_L$ and R in the recipe. |
| Allowed Range Value: | 0 to 2.2 |

Temperature Setting (° C.) (Ts)

| | |
|---|---|
| Description: | Heater target operating temperature. When the heater is at this temperature, the Voltage Ratio of the two zones is equal to Basic Voltage Ratio. |

Voltage Ratio of Setting Temperature

| | |
|---|---|
| Description: | When the temperature reaches the setting temperature within [Chamber X resistive heater servo bandwidth (° C.)], the controller is using this voltage ratio to do PIDF control. |

Table 5 describes the heater parameters for a chamber clean recipe.

TABLE 5

Heater Parameter Description - Clean Recipe

Heater Parameter Description - (parameter are located in Recipe)
Process Temperature (° C.)

| | |
|---|---|
| Parameter: | Programmed in Recipe |
| Description: | When the chamber is at process condition, the heater is served to this temperature. |
| Recommended Value: | Depends on process |

Voltage Ratio at Process Temperature

| | |
|---|---|
| Syscon: | Programmed in Recipe |
| Description: | Voltage ratio between outer zone and inner zone at process temperature within the [Servo band] |
| Limitation Value: | $R_M$ |

Ramp Rate (up or down) (° C./Minute) (over write the Target Ramp Rate)

| | |
|---|---|
| Parameter: | Programed in Recipe |
| Description: | The temperature setting is different from previous step. The Ramp rate of heater temperature is needed to be set and be controlled by software. |
| Limitation Value: | . . .° C./Minute |

The above description relates primarily to the use of a multi-zone, single-wafer heater for use in a CVD system. The invention has been described including a dual-zone heater apparatus. It is to be appreciated that additional heating elements and temperature indicators associated with the heating elements may be included without departing from the spirit or scope of the invention. It is also to be appreciated that the invention is not to be limited to CVD reactors, systems, or methods, but may find use in a variety of other applications where accurate temperature control is warranted.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
a stage comprising a surface having an area to support a wafer and a body;
a shaft coupled to the stage;
a first heating element disposed within a first plane of the body of the stage; and
a second heating element disposed within a second plane of the body of the stage that is a greater distance from the surface of the stage than the first plane of the body, wherein the first heating element supplies a variable heat energy to an area of the surface of the stage.

2. The apparatus of claim 1, wherein the first heating element occupies an area of the stage substantially the same size as an area of the stage occupied by the second heating element.

3. The apparatus of claim 1,
wherein the stage comprises a first surface to support a wafer and a second surface, and the shaft has a portion defining an interior opening through a length of the shaft,
wherein the shaft is coupled to the second surface of the stage at a point substantially corresponding to the midpoint, and power leads to each of the first heating element and the second heating element are disposed in the opening.

4. The apparatus of claim 1, wherein the stage body is substantially cylindrical such that a midpoint corresponds to an axis normal to the surface and a first portion of the area of the stage is defined by a first radius about the axis and a second portion of the area is defined by a second radius about the axis greater than the first radius.

5. The apparatus of claim 4,
wherein the first heating element is a resistive heating element comprising a first resistance in an area corresponding with the first portion of the area of the stage and a second resistance in an area corresponding with the second portion of the area of the stage, and
wherein the second heating element is a resistive heating element comprising a first resistance in an area corresponding with the first portion of the area of the stage and a second resistance in an area corresponding with the second portion of the area of the stage.

6. The apparatus of claim 5, wherein the first resistance of the first heating element is less than the second resistance of the first heating element and the first resistance of the second heating element is greater than the second resistance of the second heating element.

7. The apparatus of claim 4, wherein the power density of the first heating element is greater than the power density of the second heating element in an area corresponding with the first portion of the area of the stage and the power density of the second heating element in an area corresponding with the second portion of the area of the stage.

8. The apparatus of claim 1,
wherein the first heating element is disposed about the first portion in a pair of coils and the first portion is defined by two segments separated by a first axis, a first coil disposed in a first segment of the first portion and a second coil disposed in a second segment of the first portion, the first coil coupled to the second coil through the first axis,
wherein the second heating element is disposed about the second portion in a pair of coils and the second portion is defined by two segments separated by a second axis, a first coil disposed in a first segment of the second portion and a second coil disposed in a second segment of the second portion, the first coil coupled to the second coil through the second axis, and an intersection of the first axis and the second axis defines an angle in a plane of the surface between 0° and 180°.

9. The apparatus of claim 8,
wherein the stage body is substantially cylindrical such that a midpoint corresponds to an axis normal to the surface and a first portion of the area of the stage is defined by a first radius about the axis and a second portion of the area is defined by a second radius about the axis greater than the first radius,
wherein the power density of the first heating element is greater than the power density of the second heating element in an area corresponding with the first portion of the area of the stage and the power density of the second heating element in an area corresponding with the second portion of the area of the stage.

10. The apparatus of claim 1, wherein the stage is comprised of a material that is resilient to temperatures in excess of 750° C.

11. The apparatus of claim 10, wherein the stage and the shaft are comprised of aluminum nitride.

12. The apparatus of claim 11, wherein the stage is comprised of aluminum nitride and has a thermal conductivity in the range of 140 W/mK to 200 W/mK and the shaft is comprised of aluminum nitride and has a thermal conductivity in the range of 60 W/mK to 100 W/mK.

13. The apparatus of claim 1, wherein the area to support a wafer includes a wafer pocket depressed in the surface of the stage and having sidewalls disposed at an angle of approximately 60° to 80° relative to a plane perpendicular to the surface of the stage.

14. An apparatus comprising:
a stage comprising a surface having an area to support a wafer and a body;
a shaft coupled to the stage;
a first heating element disposed within a first plane of the body of the stage; and
a second heating element disposed within a second plane of the body of the stage that is a greater distance from the surface of the stage than the first plane of the body, wherein the first heating element is a resistive heating element comprising a first portion having a first resistance and a second portion having a second resistance different than the first resistance.

15. The apparatus of claim 14, wherein the second portion of the first heating element is disposed within an area of the stage at a greater distance from a midpoint of the area than the first portion of the first heating element.

16. The apparatus of claim 14, wherein the second heating element is a resistive heating element comprising a first portion having a first resistance and a second portion having a second resistance different than the first resistance.

17. The apparatus of claim 16, wherein the second portion of the second heating element is disposed within an area of the stage at a greater distance from a midpoint of the area than the first portion of the second heating element.

18. A reactor comprising:
a chamber; and
a resistive heater comprising a stage disposed within the chamber including a surface having an area to support a wafer and a body, a shaft coupled to the stage, a first heating element disposed within a first portion of the area of the stage and within a first plane of the body of the stage, and a second heating element disposed within a second portion of the area of the stage and in a second plane of the body of the stage, the second plane of the body of the heater is a greater distance from the surface of the stage than the first plane of the body,
wherein a power density of the first heating element is greater than a power density of the second heating element in an area corresponding with a first portion of the stage area and the power density of the first heating element is less than the power density of the second heating element in an area corresponding with a second portion of the stage area.

19. The reactor of claim 18, wherein the stage body is substantially cylindrical such that a midpoint corresponds to an axis normal to the surface and the second stage area is disposed at a greater distance from the midpoint than the first stage area.

20. The reactor of claim 18,
wherein the first heating element is disposed about the first portion in a pair of coils and the first portion is defined by two segments separated by a first axis, a first coil disposed in a first segment of the first portion and a second coil disposed in a second segment of the first portion, the first coil coupled to the second coil through the first axis,
wherein the second heating element is disposed about the second portion in a pair of coils and the second portion is defined by two segments separated by a second axis, a first coil disposed in a first segment of the second portion and a second coil disposed in a second segment of the second portion, the first coil coupled to the second coil through the second axis, and an intersection of the first axis and the second axis defines an angle in a plane of the surface between 0° and 180°.

21. The reactor of claim 18, further comprising:
a first temperature sensor disposed within the shaft positioned to measure a first temperature of the stage; and
a second temperature sensor positioned to measure a second temperature in an area of the stage corresponding to one of the first portion of the area of the stage and a second portion of the area of the stage.

22. The reactor of claim 21, wherein the first temperature sensor is a thermocouple.

23. The reactor of claim 21, wherein the second temperature sensor is a pyrometer.

24. The reactor of claim 23, wherein the chamber comprises a top surface and the pyrometer is disposed in a window in the top surface of chamber.

25. The reactor of claim 18, wherein the shaft has a portion defining an interior opening through a length of the shaft, the reactor further comprising a power source coupled to the first heating element and the second heating element through the opening in the shaft.

26. The reactor of claim 25, further comprising a controller coupled to the power source to control the temperature of the first heating element and the second heating element.

27. The reactor of claim 26, wherein the controller controls the temperature of the first heating element and the second heating element to within ±3° C.

28. The reactor of claim 27, wherein the controller is coupled to at least two of the first temperature sensor, and the second temperature sensor.

29. The reactor of claim 18, wherein the heater is comprised of a material that is resilient to temperatures in excess of 750° C.

30. The reactor of claim 29, wherein the stage is comprised of aluminum nitride and has a thermal conductivity in the range of 140 W/mK to 200 W/mK.

31. The reactor of claim 18, wherein the body of the heater has a bottom surface and a portion defining an opening through the body and substantially normal to the surface, the reactor further comprising:
a lift pin having a first end and a second end, the first end disposed within the opening through the body of the heater and the second end extending below the bottom surface of the body of the heater,
a lifter assembly coupled to the shaft to move the heater between a first position and a second position within reactor chamber; and
a lift plate coupled to the lifter assembly and having a portion disposed in the chamber, the portion disposed in the chamber including a surface extending in a direction normal to the shaft and substantially parallel to the top surface of the body of the stage, so that, when the heater is in the first position, the lift pin contacts the lift plate.

32. The reactor of claim 31, wherein the lift plate is comprised of a material that is resilient to temperatures in excess of 750° C.

33. The reactor of claim 32, wherein the lift plate is comprised of aluminum nitride and has a thermal conductivity in the range of 140 W/mK to 200 W/mK.

34. The reactor of claim 31, wherein the lift pin is comprised of one of sapphire and aluminum nitride.

35. The reactor of claim 34, wherein the opening through the body has a first portion having a first diameter to support a head of the lift pin and a second portion having a second diameter less than the first diameter.

36. The reactor of claim 18, wherein the area to support a wafer includes a wafer pocket depressed in the surface of the stage and having sidewalls disposed at an angle of approximately 60° to 80° relative to a plane perpendicular to the surface of the stage.

37. A heating system for a chemical vapor deposition apparatus comprising:
a resistive heater comprising a stage including a surface having an area to support a wafer and a body, a shaft coupled to the stage, a first heating element disposed within a first plane of the body of the stage, and a second heating element disposed within a second plane of the body of the stage, the second plane of the body of the stare is a greater distance from the surface of the stage than the first plane of the body;
a first temperature sensor disposed within the shaft positioned to measure a first temperature of the stage; and
a power source coupled to the first heating element and the second heating element.

38. The system of claim 37,
wherein a power density of the first heating element is greater than a power density of the second heating element in an area corresponding with the first portion of the area of the stage and the power density of the first heating element is less than power density of the second heating element in an area corresponding with the second portion of the area of the stage,
wherein the stage body is substantially cylindrical such that a midpoint corresponds to an axis normal to the surface and a first portion of the area of the stage is defined by a first radius about the axis and a second portion of the area is defined by a second radius about the axis greater than the first radius.

39. The system of claim 38,
wherein the first heating element is disposed about the first portion in a pair of coils and the first portion is defined by two segments separated by a first axis, a first coil disposed in a first segment of the first portion and a second coil disposed in a second segment of the first portion, the first coil coupled to the second coil through the first axis,
wherein the second heating element is disposed about the second portion in a pair of coils and the second portion is defined by two segments separated by a second axis, a first coil disposed in a first segment of the second portion and a second coil disposed in a second segment of the second portion, the first coil coupled to the second coil through the second axis, and an intersection of the first axis and the second axis defines an angle in a plane of the surface between 0° and 180°.

40. The system of claim 39, wherein the intersection of the first axis and the second axis defines an angle in a plane of the surface of at least 90°.

41. The system of claim 38, further comprising a second temperature sensor positioned to measure a second temperature corresponding to one of a first portion of the area of the stage and a second portion of the area of the stage and a third temperature sensor positioned to measure a third temperature in an area corresponding to the other of the first portion of the surface area of the stage and the second portion of the surface area of the stage.

42. The system of claim 38, wherein the shaft of the heater has a portion defining an interior opening through a length of the shaft, the system further comprising a power source coupled to the first heating element and the second heating element through the opening in the shaft.

43. The system of claim 38, further comprising a controller coupled to the power source to control the temperature of the first heating element and the second heating element.

44. The system of claim 43, wherein the controller controls the temperature of the first heating element and the second heating element to within ±2.5° C.

45. The system of claim 44, wherein the controller is coupled to at least two of the first temperature sensor, the second temperature sensor, and the third temperature sensor.

46. The system of claim 45, wherein the first temperature sensor is a thermocouple and the second temperature sensor and the third temperature sensor are each a pyrometer.

47. The system of claim 41, wherein the second temperature sensor is disposed in a first window in the exterior surface of a chemical vapor deposition chamber and the third temperature sensor is disposed in a second window in the exterior surface of the chamber.

48. The system of claim 47, further comprising a manifold coupled to the interior surface of the chamber to distribute process gases inside the chamber, the manifold positioned superiorly over the surface of the stage and having a thickness approximately three times the width of one of the first window and the second window.

49. The system of claim 37, wherein the body of the heater has a bottom surface and a portion defining an opening through the body and substantially normal to the surface, the system further comprising:
a lift pin having a first end and a second end, the first end disposed within the opening through the body of the heater and the second end extending below the bottom surface of the body of the heater,
a lift assembly coupled to the shaft to move the heater between a first position and a second position within reactor chamber; and
a lift plate coupled to the lift assembly and having a portion disposed in the chamber, the portion disposed in the chamber including a surface extending in a direction normal to the shaft and substantially parallel to the top surface of the body of the stage, so that, when the heater is in the first position, the lift pin contacts the lift plate.

50. The system of claim 49, wherein the opening through the body has a first portion having a first diameter to support a head of the lift pin and a second portion having a second diameter less than the first diameter.

51. A method comprising:
supplying a power to a first resistive heating element disposed within a first plane of the body of a stage of a resistive heater and a second resistive heating element disposed within a second plane of the body of the stage; and
varying a resistance of at least one of the first resistive heating element and the second resistive heating element in at least two areas of the stage.

52. The method of claim 51, wherein the step of varying a resistance of at least one of the first resistive heating element and the second resistive heating element comprises providing the at least one resistive heating element with a first portion having at least a first resistance and a second portion having at least a different second resistance.

53. The method of claim 51, wherein the step of varying a resistance comprises varying a resistance of the first resistive heating element and a resistance of the second resistive heating element in at least two areas of the stage.

54. The method of claim 51, wherein the resistive heater comprises a stage including a surface having an area to support a wafer and a body, the first heating element formed within a first plane of the body of the stage, and a second heating element formed within a second plane of the body of the stage, the second plane disposed at a greater distance from the surface area than the first heating element, the step of varying the resistance further comprising:
with the first heating element, providing a greater resistance in an area of the stage defined by a first radius from a midpoint than a second area defined by a second radius from the midpoint greater than the first radius, and
with the second heating element, providing a greater resistance in the second area than the first area.

55. The method of claim 51, wherein the resistive heater comprises a stage including a surface having an area to support a wafer, the method further comprising:
controlling the temperature of the surface of the stage by regulating the power supplied to the resistive heating elements.

56. The method of claim 55, further comprising:
measuring the temperature with at least two temperature sensors, a first temperature sensor disposed within a shaft extending from a bottom surface of the stage, the first temperature sensor positioned to measure a first temperature of the stage and a second temperature sensor positioned to measure a second temperature in a first area of the stage defined by a first radius from a midpoint and a second area defined by a second radius from the midpoint; and
comparing the temperature measured by the first temperature sensor and the temperature measured by the second temperature sensor.

57. The method of claim 56, wherein the step of controlling the temperature comprises controlling the compared temperature to within ±2.5° C. at temperatures around 750° C.

58. A method comprising:
providing a resistive heater in a chamber of a reactor, the resistive heater comprising a stage disposed within the chamber including a surface having an area to support a wafer and a body, a first heating element having a first power density and a second power density, the first heating element formed within a first plane of the body of the stage, and a second heating element having a first power density and a second power density, the second heating element formed within a second plane of the body of the stage, the second plane disposed at a greater distance from the surface than the first heating element; and
supplying a power to the first heating element and to the second heating element.

59. The method of claim 58,
with the first heating element, providing a greater power density in an area of the stage defined by a first radius from a midpoint than a second area defined by a second radius from the midpoint greater than the first radius, and
with the second heating element, providing a greater power density in the second area than the first area.

60. The method of claim 58, further comprising:
controlling the temperature of the surface of the stage by regulating the power supplied to the resistive heating elements.

61. The method of claim 60, further comprising:
measuring the temperature with at least two temperature sensors, a first temperature sensor disposed within a shaft extending from a bottom surface of the stage, the first temperature sensor positioned to measure a first temperature of the stage and a second temperature sensor positioned to measure a second temperature in a first area of the stage defined by a first radius from a midpoint and a second area defined by a second radius from the midpoint.

62. The method of claim 60, the step of controlling the temperature further comprising controlling the temperature of the stage such that the second temperature measurement and the third temperature measurement are within ±3° C. at temperatures around 750° C.

\* \* \* \* \*